United States Patent
Meltzer

(10) Patent No.: US 7,167,058 B2
(45) Date of Patent: *Jan. 23, 2007

(54) TEMPERATURE COMPENSATION FOR A VARIABLE FREQUENCY OSCILLATOR WITHOUT REDUCING PULL RANGE

(75) Inventor: David Meltzer, Wappingers Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 59 days.

This patent is subject to a terminal disclaimer.

(21) Appl. No.: 10/733,094

(22) Filed: Dec. 11, 2003

(65) Prior Publication Data

US 2005/0128017 A1 Jun. 16, 2005

(51) Int. Cl.
*H03B 1/00* (2006.01)
(52) U.S. Cl. ............... 331/76; 331/176; 331/175; 331/74; 331/DIG. 3
(58) Field of Classification Search .......... 331/76, 331/176, 74, DIG. 3, 175
See application file for complete search history.

(56) References Cited

U.S. PATENT DOCUMENTS

| | | | |
|---|---|---|---|
| 4,316,108 A | 2/1982 | Rogers, Jr. | |
| 4,378,534 A | 3/1983 | Goedken et al. | |
| 4,492,933 A | 1/1985 | Grieco | |
| 4,999,589 A | 3/1991 | DaSilva | |
| 5,097,228 A | 3/1992 | McJunkin | |
| 5,604,468 A | 2/1997 | Gillig | |
| 5,740,525 A | 4/1998 | Spears | |
| 5,977,839 A | 11/1999 | Tsumura | |
| 6,198,356 B1 | 3/2001 | Visocchi et al. | |
| 6,225,871 B1* | 5/2001 | Chien | 331/117 FE |
| 6,323,739 B1 | 11/2001 | Andrews | |
| 2002/0149434 A1* | 10/2002 | Toncich et al. | 331/158 |

* cited by examiner

*Primary Examiner*—Michael B. Shingleton
(74) *Attorney, Agent, or Firm*—Rosalio Haro

(57) ABSTRACT

A variable frequency oscillator having multiple, independent frequency control inputs, each coupled to a respective tuning sub-circuit. The tuning sub-circuits are connected in parallel with each other and with a resonator module, which may be a quartz crystal, inductor, or other reactance component. Each tuning sub-circuit consists of two varactors with their respective cathodes coupled to each other and to their corresponding frequency control input. By having the tuning sub-circuits connected in parallel to the resonator, the overall frequency pull range of each frequency control input remains unaffected by the activation of any other frequency control input. Preferably, at least one frequency control input is a temperature compensation control input that can maintain the variable oscillator insensitive to temperature variations while the remaining frequency control inputs provide functional frequency control.

33 Claims, 14 Drawing Sheets

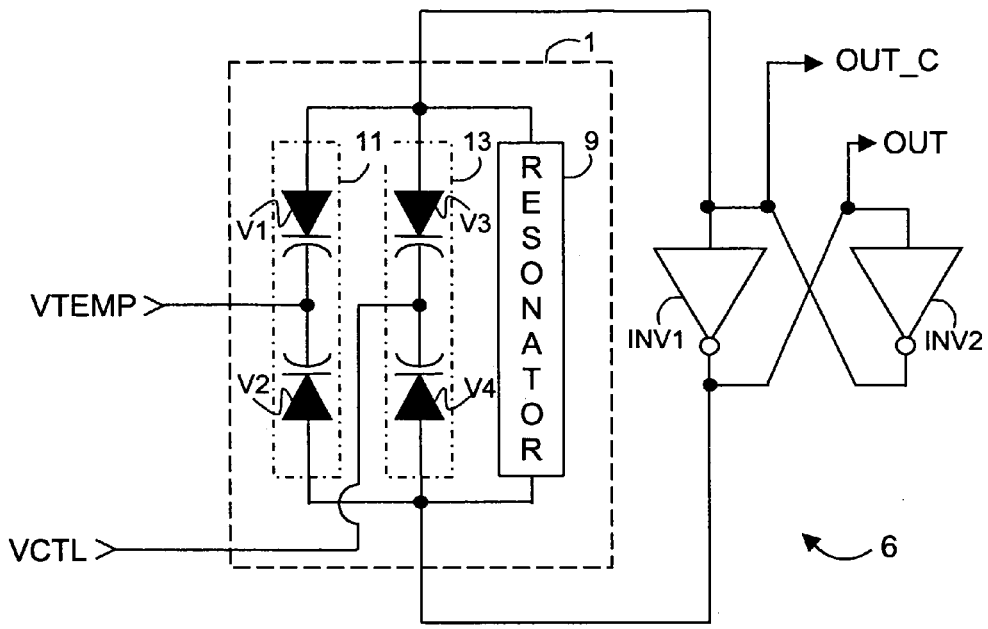
FIG. 17
FIG. 18
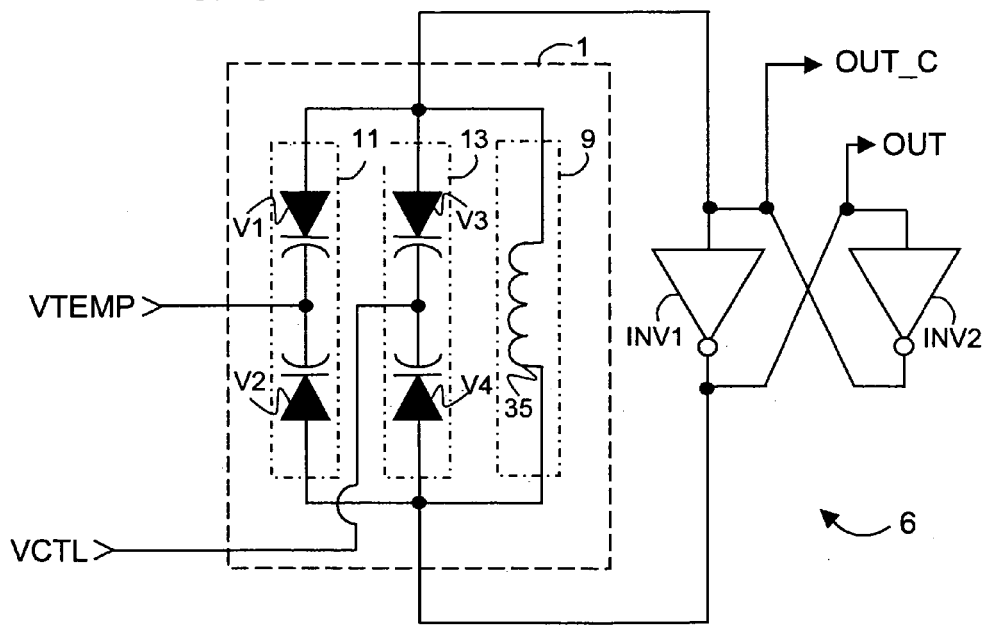

TEMPERATURE COMPENSATION FOR A VARIABLE FREQUENCY OSCILLATOR WITHOUT REDUCING PULL RANGE

BACKGROUND OF THE INVENTION

1. Field of the Invention

The present invention relates generally to variable frequency oscillators and in particular to variable frequency oscillators which must maintain a particular frequency of oscillation despite temperature variations. The present invention further relates to oscillators that must provide sufficient frequency pull range to respond to both frequency compensation circuitry and to frequency correction signals due to normal circuit operations.

2. Description of the Related Art

Voltage or current controlled variable frequency oscillators are frequently used in precision clock generators for digital systems. Such variable oscillators have a frequency control input that permits the oscillator's frequency to be modified in accordance with a frequency control signal. However, the oscillator's operating range for responding to the frequency control signal is limited, if not by the particular architecture of the oscillator then by the physical limitations of the circuit itself. For example, a voltage controlled oscillator, VCO, has a frequency control input whose control voltage range is ultimately limited by the supply voltages. Furthermore, the operating range of the frequency control signal is shared by all mechanisms that require frequency control of the oscillator.

For example, in addition to normal frequency selection input control, a precision oscillator may need to compensate for normal circuit variations, such as voltage fluctuations. This is typically done via a feedback path that provides automatic frequency control, AFC, by monitoring the output frequency and applying an appropriate frequency compensation signal to offset any observed frequency variations.

Furthermore, precision oscillators typically also require temperature compensation frequency control to compensate for temperature variations. In these systems, a temperature sensor monitors temperature variations and applies a frequency compensation signal to the variable oscillator so as to offset the natural frequency drift effects of temperature variations on the oscillator.

In the above mentioned frequency compensation techniques, it is important that the oscillator's frequency control input range (i.e. the control voltage range in a VCO) be large enough to accommodate the added frequency control requirements of the AFC and/or temperature compensation control mechanisms. Thus, oscillators that provide temperature compensation control require that their total available frequency compensation input range include sufficient frequency pull range to respond to the temperature compensation signal in addition to the required functional control range for compensating for normal system frequency variations.

However, since the total control range is limited by the supply voltages, the needed temperature compensation requirements necessarily reduces the functional frequency pull range of the oscillator. This imposes more stringent requirements on the functional behavior of the oscillator.

Thus, a precision oscillator would sometimes have either an automatic frequency control, AFC, mechanism with no temperature compensation circuitry; in which case the oscillator would necessarily be constructed of expensive temperature insensitive components or be limited to more stringent ambient operating conditions. Alternatively, the oscillator would have a temperature compensation circuit, but limited frequency compensation control for normal circuit variations; in which case the oscillator would need to be constructed to very stringent normal operating requirements.

An added reason for the limited use of both temperature and circuit fluctuation frequency control is that since an AFC functions by observing the output frequency and attempting to correct for any observed frequency variations, an AFC would tend to respond to both non-intended changes in frequency due to circuit fluctuations and to purposely applied frequency compensation correction from a temperature compensation circuit. In effect, the AFC would tend to reduce the effectiveness of the temperature compensation.

One approach to addressing this issue is shown in U.S. Pat. No. 5,977,839 to Tsumura in which an oscillator having both temperature compensation control and AFC control is shown. In this case, Tsumura adds the temperature compensation signal and the AFC control signal to form one composite control signal that is applied to a frequency control input of an oscillator. To reduce the amount of interference between the temperature compensation control operation and the AFC operation, Tsumura uses a system in which the temperature compensation circuit and the AFC control circuit take turns separately observing and modifying the oscillator's operation. That is, Tsumura's system first holds the output of the AFC circuit constant while the temperature compensation circuit is operating, and then holds the output of the temperature compensation circuit constant while the AFC circuit is operating. As a result, however, Tsumura suggests converting the control signals from the temperature compensation circuit and from the AFC circuit into digital form in order to hold the respective control signals in digital latches, and to more easily sum the control signals from the temperature compensation and AFC circuits. This, of course, also requires a digital-to-analog converter in order to apply an analog representation of the composite (i.e. summed) digital control signals to the frequency control input of the oscillator.

Tsumura's approach offers only a partial solution, however, since the temperature compensation circuit and the AFC circuit cannot provide independent, and concurrent, control over the oscillator (i.e. one is halted while the other is in operation), and further does not address the issue of reduced frequency pull range due to the need to accommodate the corrective pulling action of both the temperature compensation circuit and the AFC circuit.

A method of improving the precession of an oscillator so as to reduce the need for much tuning later when in normal use, is to fine tune the oscillator's operating conditions at the manufacturing stage prior to it being shipped to a customer. U.S. Pat. No. 6,323,739 to Andrews shows a system wherein a reference signal, A/D converter, ROM, and D/A converter are used to fine tune an oscillator while it is still at the manufacturing stage. That is, the oscillator is activated and its performance is fine tuned at the manufacturing stage using the reference signal to select appropriate bias levels that pull the oscillator's frequency until a desired target frequency is achieved. The appropriate bias levels are stored in the ROM, and thus optimal bias conditions for high precision operation are fixed into the oscillator prior to it being shipped to a customer.

Andrews uses load pulling to alter the frequency of his oscillator at the manufacturing stage. Load pulling typically provides only a very small tuning range, and consequently Andrews uses this load pulling technique only at the manufacturing stage to fine tune the oscillator to the target frequency, and does not rely on load pulling for normal use by customers. This is substantiated by Andrews's use of a more traditional tuning technique in his complete system, where oscillation tuning is provided by summing a functional tuning voltage and a correction voltage and applying the sum to a single input of this oscillator. This permits Andrews to obtain a larger correction range than would be possible with load pulling, but still suffers from the limitation of a reduced functional tuning range since the functional tuning voltage and correction voltage are still being summed, as explained above. Thus, although Andrews's approach may reduce the amount of tuning required later when in normal use by a customer, it does not address the issue of how to provide multiple frequency control mechanisms with sufficient control range for each, given the limited and finite tuning range of an oscillator's frequency control input. Basically, Andrews does not show how, for example, sufficient temperature compensation control and function frequency control may be achieved within the limited range of the oscillator's frequency control input.

What is needed is a means of providing temperature compensation control without reducing the frequency tuning range (i.e. voltage range for frequency control) of the oscillator available for normal functional frequency control.

OBJECTS OF THE INVENTION

One object of the present invention is to provide a variable frequency oscillator with multiple independent frequency control inputs.

Another object of the present invention is to provide a general method for introducing multiple secondary frequency controls into an variable oscillator without reducing the range for functional frequency pull range.

An additional object of the present invention is to provide an oscillator that has independent and concurrent temperature compensation control and functional frequency control.

A further object of the present invention is to provide an oscillator that has both temperature compensation control and normal functional frequency pull control without reducing the pull range available for normal functional pull control.

SUMMARY OF THE INVENTION

The present objects are achieved in an oscillator having a mechanism to generate a temperature compensation voltage or current, and having a separate means to introduce it into the oscillator to tune the oscillator in an inverse manner to its temperature versus frequency characteristics without reducing its voltage range for functional frequency pull control.

A method of introducing a plurality of frequency control signals into a variable frequency oscillator is disclosed. In one aspect of the present invention, varactor diodes, which are used to transform an input control voltage into an oscillator frequency difference, are duplicated, with one set used to provide conventional frequency control and a second set to used to provide temperature based control. In another aspect of the present invention, various methods of generating temperature based control voltage are illustrated.

Generally, the variable oscillator consists of a resonant circuit, a gain stage, and a phase shift network. The gain stage and phase shift network may be combined, if desired. Preferably, the resonant circuit include a resonator, such as a quartz crystal, inductor, capacitor, or tank circuit, and further includes multiple independent tuning circuits. The tuning circuits may vary their reactance value in response to an applied control input. The tuning circuits are connected in parallel to each other and to the resonator, such that adjusting the reactance value of any tuning circuit results in a frequency pulling effect on the resonator.

Each tuning circuit preferably consists of two varactor diodes, with their respective cathode electrodes coupled to each other and to their corresponding control input. Since each tuning circuit is connected in parallel to the resonator, the frequency pull range of any one tuning circuit is not limited by the pull range of any other tuning circuit. Thus, one tuning circuit may be dedicated to provide frequency compensation control, while not reducing the pull range of the remaining functional frequency control tuning circuits.

A temperature compensation circuit is coupled to the resonator circuit for providing a temperature compensation signal. The temperature compensation circuit may be digital, in which case it is preferably constructed of an ADC monitoring a temperature sensing diode, a non-volatile memory to accept the output from the ADC and identify a corresponding corrective voltage value, and a DAC to convert the output from the non-volatile memory into an analog control input applied to the resonant circuit.

Alternatively, the temperature compensation circuit may be analog based using multiple first and second modules. Preferably, the first modules provide temperature sensitive signals that are directly proportional to temperature, and the second modules provide temperature sensitive signals that are inversely proportional to temperature. The outputs of first and second modules are combined, i.e. summed, to construct a composite temperature sensitive signal. Further preferably, each module can have its signal strength adjusted, and can be assigned a temperature offset. The temperature offset is effective for preventing a module from outputting a temperature sensitive signal until the assigned temperature offset is reached. By appropriate selection of the number of first and second modules, appropriate assignment of signal strength and temperature offset values, a composite temperature sensitive signal may be constructed to have a shape that is the inverse of the frequency-versus-temperature characteristic curve of an oscillator.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 17 shows an alternate embodiment for a variable oscillator in accord with the present invention.

FIG. 18 shows the use of an inductor to implement the resonator of the present invention.

DESCRIPTION OF THE PREFERRED EMBODIMENTS

Figure 1:
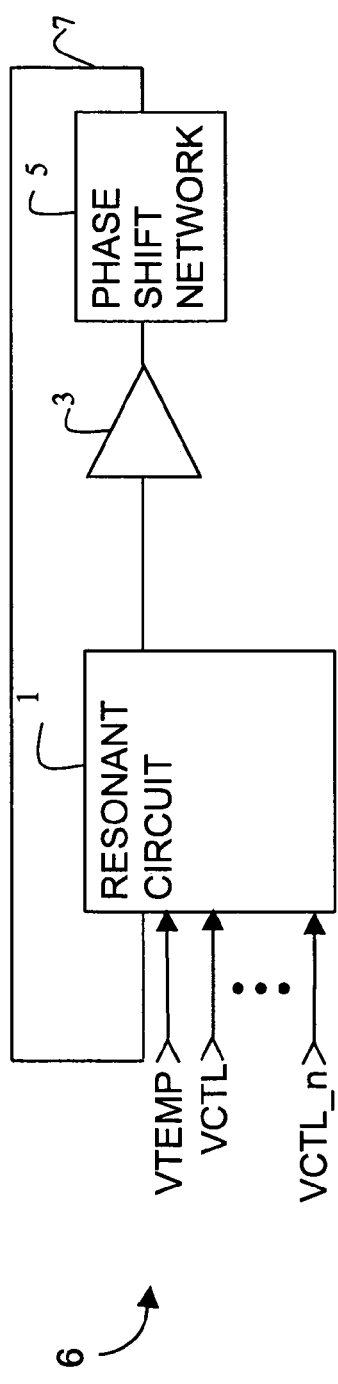
FIG. 1 is a block diagram of a variable oscillator in accord with the present invention.

Preferred embodiments of the present invention are described below with reference to the accompanying figures, where like elements are identified with common reference characters.

With reference to FIG. 1, a variable oscillator 6 in accord with the present invention includes a resonant circuit 1 having multiple frequency control inputs VTEMP and VCTL through VCTL_n. As is typical of oscillators, oscillator 6 preferably additionally includes an amplifying stage 3 and a phase shift network 5 in a feedback loop around resonant circuit 1.

In the present case, resonant circuit 1 has a single temperature compensation control input VTEMP and multiple functional frequency control inputs VCTL through VCTL_n. Each frequency control input VTEMP and VCTL through VCTL_n is independent of each other and thus all can provide active frequency control concurrently, and each has an independent control range such that the control range of any one control input is not reduced by the operation of any other control input. For example, if oscillator 6 is a voltage controlled oscillator whose frequency control range is ultimately limited to a voltage range, V_range, defined by the voltage difference of the power rails, then each of frequency control inputs VTEMP and VCTL through VCTL will have the same maximum functional control range, V_range.

For ease of illustration, the following discussions will assume only two independent frequency control inputs, VTEMP and VCTL, for resonant circuit 1. It is to be understood that additional independent frequency control inputs may be achieved by following similar methods/structures as those disclosed below with reference to the implementation of VTEMP and VCTL.

Figure 2:
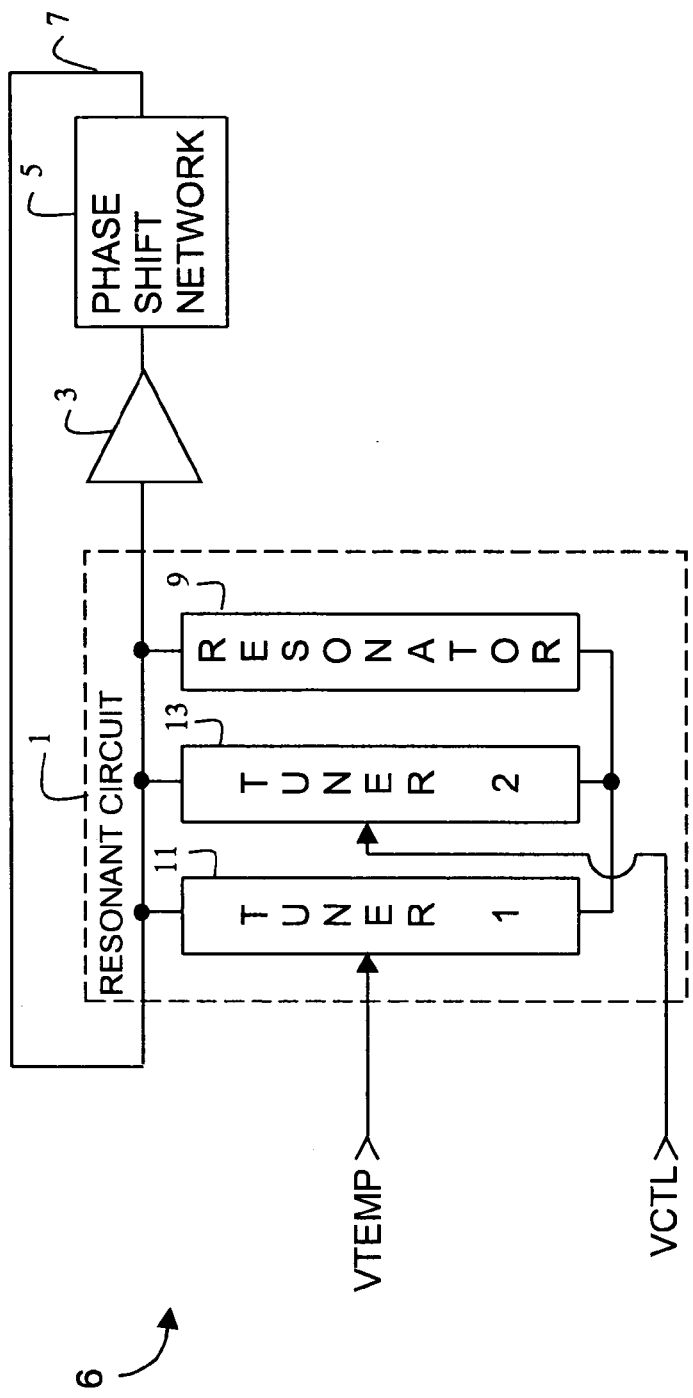
FIG. 2 shows the an internal block structure of the resonant circuit of FIG. 1.

Therefore in FIG. 2, resonant circuit 1 is shown with only two independent frequency control inputs, VTEMP and VCTL. A simplified block structure of resonant circuit 1 shows it to be constructed of a resonator 9 in parallel with multiple tuner circuits 11 and 13. Each tuner circuit 11 and 13 is independently controlled by respective control inputs, VTEMP and VCTL. In the present structure, resonant circuit 1 has a separate tuner circuit per control input, with all tuner circuits connected in parallel with each other and with resonator 9.

Since tuner circuits 11 and 13 are connected in parallel, they do not affect their respective control ranges. For example, if the control range is limited by the voltage potential between feedback line 7 and ground, then each of tuner circuits 11 and 13 will have access to the full voltage difference between feedback line 7 and ground since the full voltage difference is independently applied to both tuner circuits 11 and 13. Furthermore, since tuner circuits 11 and 13 are connected in parallel with resonator 9, each tuner circuit 11 and 13 can independently affect the tuning of resonator 9. Basically, temperature compensation input VTEMP ensures that the center frequency for the VCTL input (i.e. the oscillation frequency when VCTL is at the midpoint of its range) remains constant over a full, predefined temperature range. Thus, the pull range of variable oscillator 6 is independent of temperature and retains full symmetry no matter what the VTEMP voltage is.

It is to be understood that resonator 9 can be any type of variable impedance resonating circuit or device, such as a crystal resonator, a tank circuit, and a capacitive or inductive circuit. Furthermore, if resonator 9 is implemented as a predominantly capacitive circuit, then at least one of tuner circuits 11 and 13 may be implemented as a variable inductive circuit in order to form a tank circuit with resonator 9. Similarly, if resonator 9 is implemented as a predominantly inductive circuit/element, then at least one of tuner circuits 11 and 13 may be implemented as a variable capacitive circuit/element in order to form a tank circuit with resonator 9.

Figure 3:
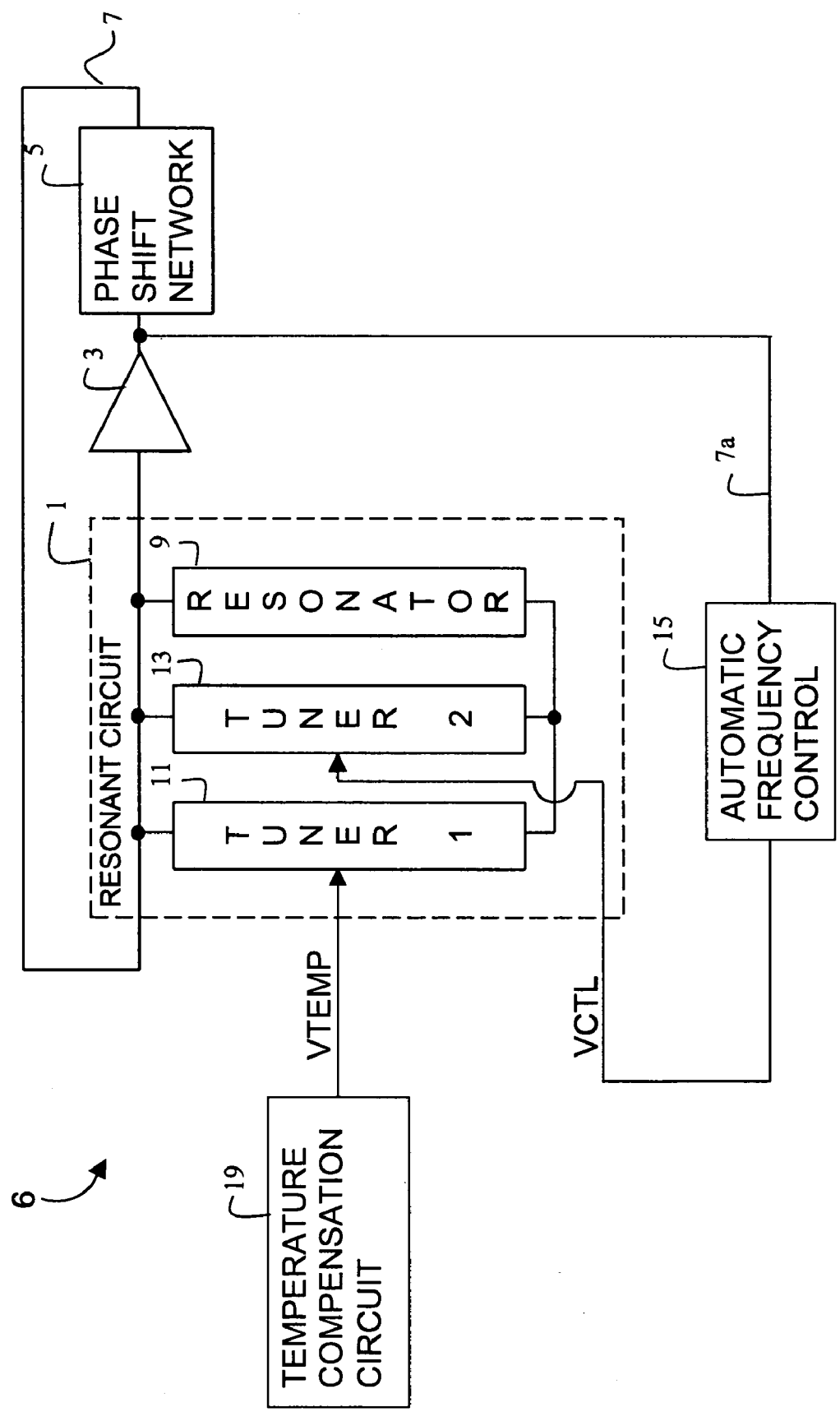
FIG. 3 incorporates a temperature compensation circuit and an automatic frequency control unit into the structure of FIG. 2.

As shown in FIG. 3, temperature compensation control input VTEMP is typically provided by a temperature control circuit 19 that may optionally be a part of oscillator 6 itself, and functional frequency control input VCTL may be provided by an automatic frequency control circuit, AFC, 15. In the present case, AFC 15 monitors the frequency output 7a from amplifier 3 and adjusts control input VCTL to compensate for any observed variations in frequency. AFC 15 may observe the frequency at any point in the feedback loop of oscillator 6, such as observing frequency variations on feedback line 7. Furthermore, since the tuning function of AFC 15 is independent of the tuning function of temperature control circuit 19, the operation of temperature control circuit 19 does not interfere with the operation of AFC 15.

Figure 4:
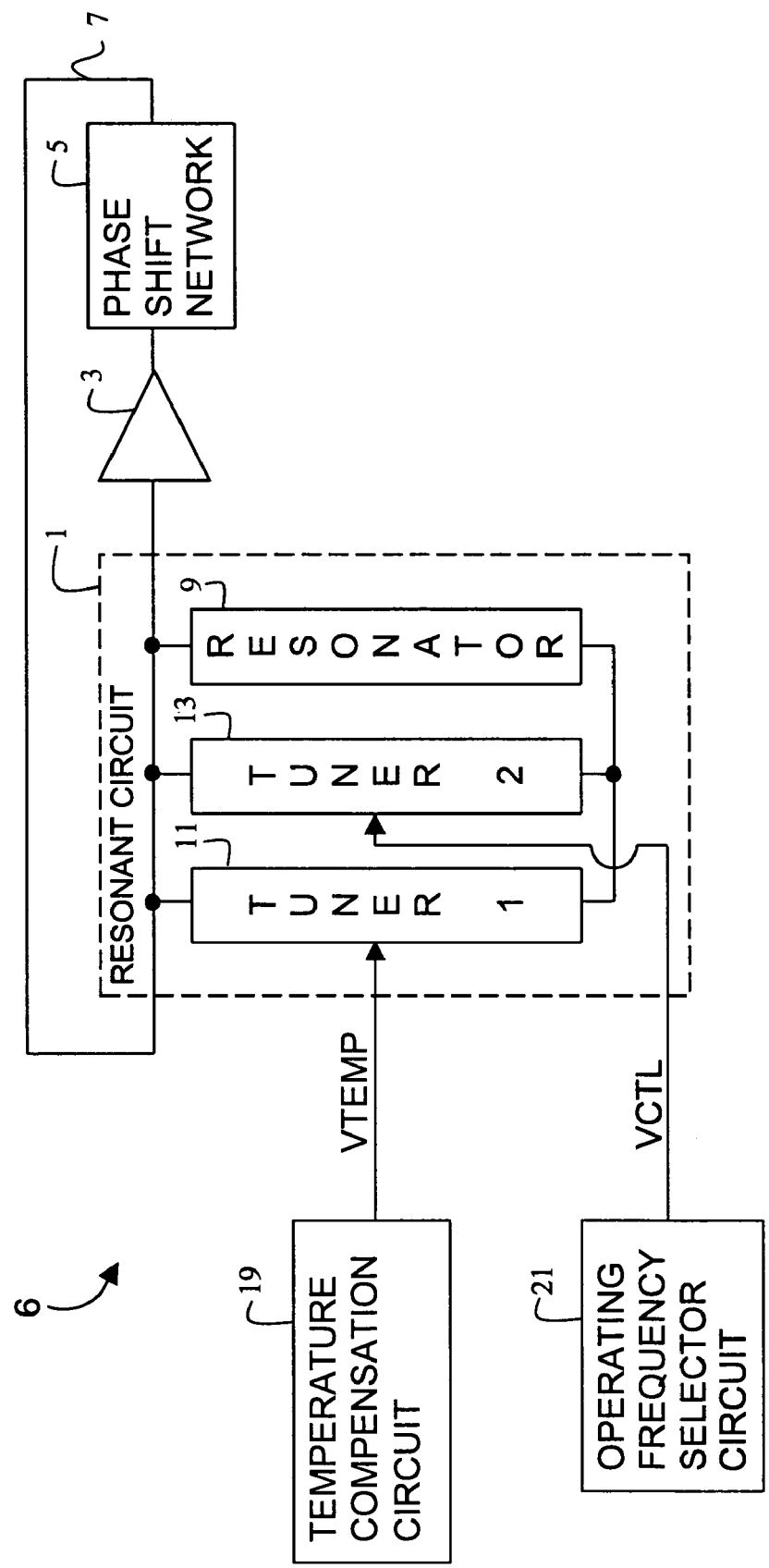
FIG. 4 incorporates a temperature compensation circuit and an operating frequency selector circuit into the structure of FIG. 2.

With reference with FIG. 4, VCTL may optionally be controlled by a frequency selector circuit 21 that selects, i.e. tunes, the operating frequency of oscillator 6. In this case, frequency selector circuit 21 does not have a feedback path from the output of oscillator 6. It is to be understood that an oscillator in accord with the present invention may include both frequency selector circuit 21 and AFC 15 of FIG. 3. In this case, one would provide a separate tuning circuit connected in parallel with resonator 19 for each of frequency selector circuit 21 and AFC 15. All elements in FIG. 4, and other figures, similar to those of FIGS. 1–3 are identified by similar reference characters and are explained above.

Temperature compensation circuit 19 may be implemented in multiple ways, but its objective function is to make the operating frequency of oscillator 6 insensitive to temperature variations. For example, functional frequency control input VCTL is characterized by a predefined operating range, and temperature compensation circuit 19 is effective for maintaining the operating frequency of oscillator 6 independent of temperature when frequency control input VCTL is at the midpoint of its predefined operating range. Stated differently, oscillator 6 is characterized by a frequency-versus-temperature characteristic curve that specifies how the frequency of oscillator 6 drifts with changing temperature, and the purpose of temperature compensation circuit 19 is to tune oscillator 6 in an inverse manner to its temperature-versus-frequency characteristics without reducing the control range for functional frequency pull control. Two implementations of temperature compensation circuit 19 are shown below.

Figure 5:
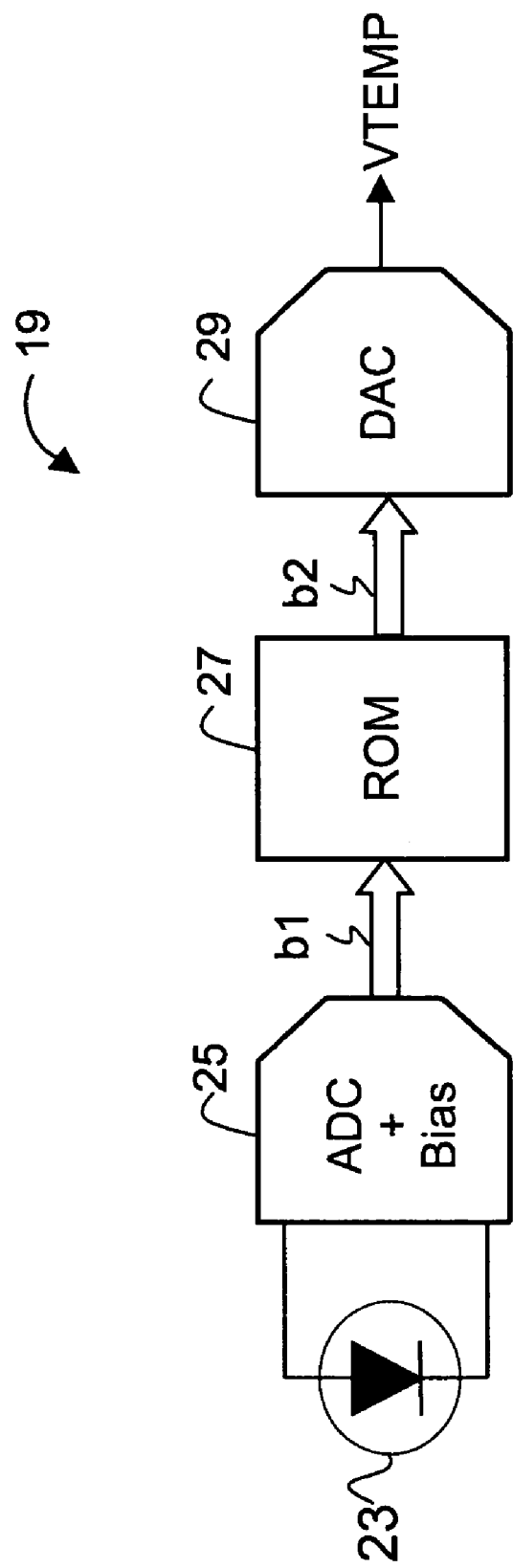
FIG. 5 is a first embodiment of a temperature compensation circuit in accord with the present invention.

With reference to FIG. 5, a first implementation of temperature compensation circuit 19 includes a temperature sensing diode 23 coupled to an analog-to-digital converter, ADC, 25. ADC 25 biases diode 23 into conduction, and converts the $V_{be}$ voltage of diode 23 into a digital signal on parallel bus b1. The $V_{be}$ voltage value on bus b1 is applied to the address input of a read only memory, ROM, 27. It is to be understood that ROM 27 may be any form of non-volatile memory, such as an eprom, eeprom, or flash memory. ROM 27 preferably stores multiple compensation voltage values corresponding to various temperatures. Therefore, the $V_{be}$ voltage on bus b1 is matched to a corresponding corrective voltage value within ROM 27 that is output onto a second bus b2. The corrective voltage value on bus b2 is applied to a digital-to-analog converter, DAC, 29, which converts the digital voltage value on bus b2 into an analog temperature compensation signal to produce frequency control input VTEMP on oscillator 6, as shown in FIGS. 1–4.

Figure 6:
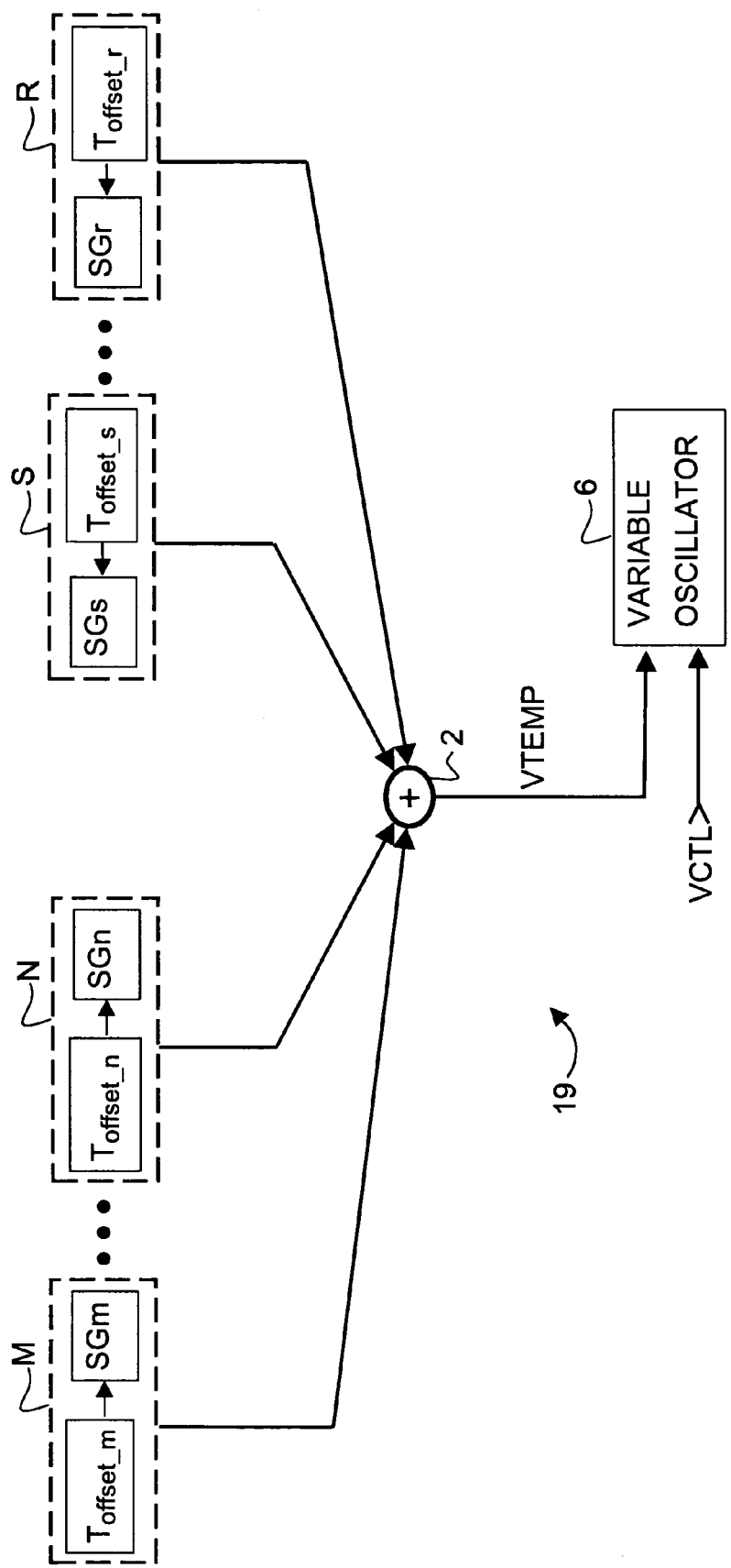
FIG. 6 is a second embodiment of a temperature compensation circuit in accord with the present invention.

An alternate implementation for temperature compensation circuit 19, which does not require an ADC, DAC, ROM, or digital buses is shown in FIG. 6. A general block diagram of this preferred circuit structure for temperature compensation circuit 19 in accord with the present invention includes several individually modifiable modules M to N and R to S. The turn-on temperature point and the signal strength of each circuit module M to N and R to S is preferably adjustable, and the signals from the modules are summed to produce frequency control input VTEMP as a composite temperature compensation signal having a specifically desired curvature over a given temperature range. Inputs VTEMP and VCTL are applied to variable oscillator 6.

M to N and R to S are temperature dependent, signal generating modules whose outputs are summed at summation node 2 to produce a composite compensation output, i.e. produce VTEMP, which is the temperature compensation input of variable oscillator 6. Each of signal modules M to N and R to S preferably produces a temperature dependent signal that is either directly proportional to temperature (i.e. modules M to N) or inversely proportional to temperature (i.e. modules R to S), and whose magnitude is weighted (i.e. amplified positively or negatively) to achieve a desired shape for temperature compensation input VTEMP. Additionally, each module is optionally capable of inhibiting its output (i.e. produce no output) until a pre-assigned temperature offset is reached. Further preferably, each module M to N and R to S may optionally be made to shift its characteristic temperature curve up or down in temperature, as specified by the temperature offset.

To achieve this, each module M to N and R to S is shown to include a temperature dependent signal generator (SGm to SGn and SGr to SGs), each having a characteristic temperature dependent curve. Each module may further include an optional temperature offset indicator ($T_{offset\_m}$ to $T_{offset\_n}$ and $T_{offset\_r}$ to $T_{offset\_s}$) for setting the desired temperature offset. Each temperature offset indicator may function to inhibit the output of its corresponding signal generator until a predefined temperature is reached, or alternatively may function to shift the characteristic temperature curve of its corresponding signal generator by the predefined temperature offset.

For example, modules M to N include respective signal generators SGm to SGn, each of which produces a temperature dependent signal whose magnitude is directly proportional to temperature (i.e., $\alpha T$). Modules M to N further preferably include respective temperature offset circuits $T_{offset\_m}$ to $T_{offsett\_n}$, which determine at what temperature their corresponding signal generators SGm to SGn will begin to output their temperature dependent signals (that is, each temperature offset circuits set the minimum operating [i.e. turn-on] temperature of its respective module). It is to be understood that if no specific temperature offset is desired for a particular module, then the module's corresponding temperature offset circuit may be omitted so that its corresponding signal generator is permitted to function without any temperature offset. This would be similar to a temperature offset circuit applying a signal indicative of no temperature offset to its corresponding signal generator. It is further to be understood that although each module's signal generator and temperature offset circuit and are shown separately, they may be combined into a single circuit structure comprising a signal generator with an assigned, but nonetheless integral, temperature offset circuit.

Similarly, modules R to S respectively include signal generators SGr to SGs, each of which produces a temperature dependent signal whose magnitude is inversely proportional to temperature (i.e., $\alpha[1/T]$). Each module R to S may further include an optional temperature offset circuit $T_{offset\_r}$ to $T_{offset\_s}$, which determines at what temperature its corresponding signal generator SGr to SGs begins outputting its temperature dependent signal (i.e. sets the turn-on temperature). It is to be understood that if no specific temperature offset is desired for a particular signal generator, then its corresponding temperature offset circuit may be omitted. Alternatively, the temperature offset circuit may be integrally constructed into the signal generator.

By appropriate selection of the number of signal generators directly proportional to temperature (SGm to SGn), appropriate selection of the number of signal generators inversely proportional to temperature (SGr to SGs), appropriate assignment of their relative signal strengths (positive or negative), and appropriate selection of their temperature offsets, composite temperature compensation input VTEMP may be made to have a shape that is the inverse of the frequency-versus-temperature characteristic curve of oscillator 6, irrespective of the type of oscillator.

That is, different types of oscillators have differently shaped frequency-versus-temperature characteristic curves, and so the number and strength of modules M-N and S-R need to be selected to produce an inverse temperature compensation signal of sufficient accuracy. For example, the frequency-versus-temperature characteristic curve of crystal-based oscillators varies with the type of crystal used. An AT-cut crystal typically has an S-shaped frequency-versus-temperature characteristic curve. The frequency of this types of oscillator tends to initially increase with increasing temperature up to a first point, then decrease with increasing temperature up to a second point, and then once again increase with increasing temperature beyond the second point. For illustrative purposes, however, the present description of temperature compensation circuit 19 assumes that variable oscillator 6 is a surface acoustic wave (SAW) resonator, whose frequency-versus-temperature characteristic curve generally has a concave-down, curved shape, as shown in FIG. 7.

Figure 7:
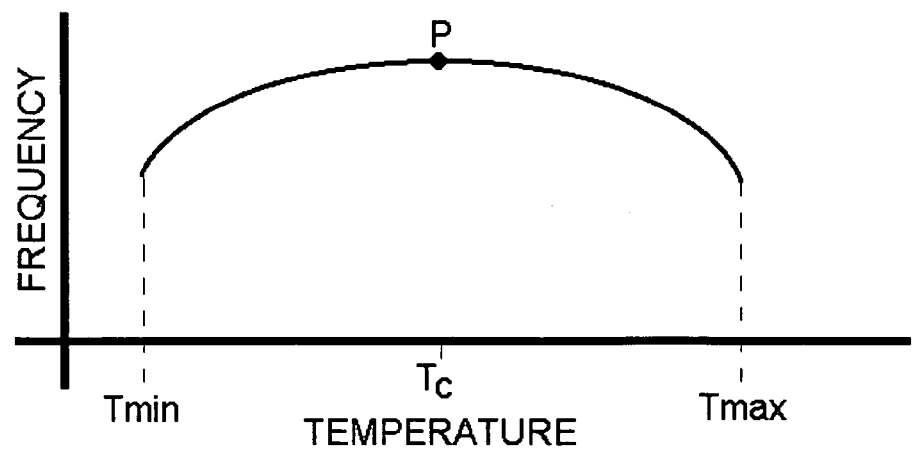
FIG. 7 is an exemplary frequency-versus-temperature characteristic curve of a SAW resonator.

With reference to FIG. 7, the qualitative shape of the frequency-versus-temperature characteristic curve of a surface acoustic wave resonator without temperature compensation has a generally curved shape. The uncompensated frequency initially increases with increasing temperature and then begins to level off. At a center temperature Tc, the frequency reaches a peak (indicated by point P) and then begins to decrease with increasing temperature. This results in the frequency-versus-temperature characteristic curve of the SAW resonator having a generally concave-down shape with a peak uncompensated frequency at temperature Tc, generally mid-way within the operating temperature range of interest (i.e. from Tmin to Tmax). Observation further reveals that the exemplary SAW resonator may exhibit a frequency variation of about 100 ppm, or more, over the temperature range of interest.

To offset this drift in oscillation frequency, a temperature compensation circuit should ideally provide a temperature compensation signal whose shape is the inverse of the frequency-versus-temperature characteristic curve of the uncompensated oscillator. That is, when the oscillator's uncompensated frequency would tend to increase due to a change in temperature, the temperature compensation signal should instruct the oscillator to decrease its output frequency to maintain its frequency stable. Similarly, when the oscillator's uncompensated frequency would tend to decrease due to a change in temperature, the temperature compensation signal should instruct the oscillator to increase its output frequency to maintain its frequency stable.

In the present case, therefore, the preferred compensation circuit should produce a compensation signal having a concave-up curvature over the temperature range from Tmin to Tmax, and having its minimum value at Tc, i.e. the temperature corresponding to point P, where the oscillator's maximum uncompensated frequency occurs. The compensation signal may be a voltage or current signal, and the oscillator maybe a voltage controlled oscillator (VCO) or a current controlled oscillator (CCO). In the proceeding discussion, it is assumed that variable oscillator 6 is a voltage controlled oscillator.

Although a temperature compensation signal whose curvature is the exact inverse of the frequency-versus-temperature characteristic curve of FIG. 7 can be achieved by the use of an appropriate number of modules M-N and R-S and by their appropriate assignment of gain and temperature offsets, many practical applications do not require that the temperature compensation signal be an exact inverse of the frequency-versus-temperature characteristic curve. Satisfactory performance can often be obtained by assuring that the compensation signal has a generally inverse shape, and that its peaks coincide with selected peaks on the frequency-versus-temperature characteristic curve. This permits construction of a simplified compensation circuit in accord with the present invention.

Figure 8:
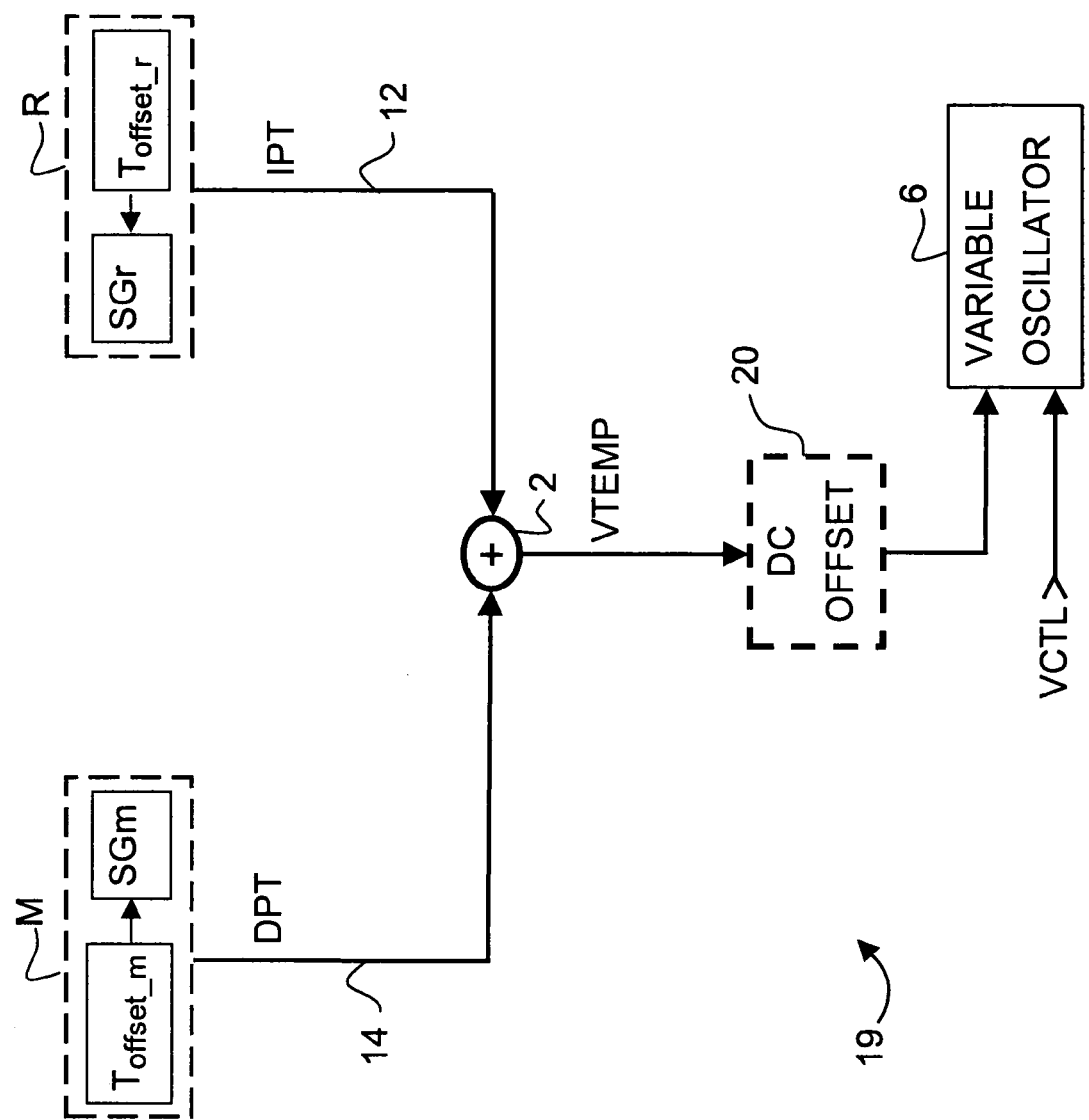
FIG. 8 is a block diagram of a frequency compensation circuit in accord with a preferred embodiment of the present invention.

Therefore with reference to FIG. 8, the presently preferred embodiment for temperature compensation circuit 19 uses only two modules, M and R, to provide a simplified implementation for producing a temperature compensation signal having a shape that is substantially the inverse of the frequency-versus-temperature characteristic curve of FIG. 7. First module M produces an output sub-signal DPT on line 14 that is directly proportional to temperature, and second module R produces an output sub-signal IPT on line 12 that is inversely proportional to temperature. Sub-signals DPT and IPT are combined at summing node 2, and the resultant temperature compensation input VTEMP may be directly applied to variable oscillator 6.

Alternatively, temperature compensation input VTEMP may be coupled to variable oscillator 6 via an optional DC offset 20 (indicated by a dotted box) to add a positive or negative DC offset to temperature compensation input VTEMP prior to it being applied to variable oscillator 6. This provides a further adjustment to the temperature compensation of variable oscillator 6, if necessary.

First module M includes temperature offset circuit $T_{offset\_m}$ for setting a first offset temperature $T_1$, and includes signal generator SGm whose output is directly proportional to temperature. Signal generator SGm is responsive to temperature offset circuit $T_{offset\_m}$. Second module R includes signal generator SGr whose output is inversely proportional to temperature, and may optionally include temperature offset circuit $T_{offset\_r}$ for setting a second offset temperature $T_2$. Signal generator SGr is responsive to temperature offset circuit $T_{offset\_r}$. However in the present implementation, temperature offset $T_2$ is preferably set to zero offset, and optional temperature offset circuit $T_{offset\_r}$ may therefore be omitted.

Since in the presently preferred embodiment, it is not necessary for signal generator SGr to have a temperature offset $T_2$ to achieve a concave-up shape for temperature compensation input VTEMP, temperature offset circuit $T_{offset\_r}$ is not used in the below-described embodiment of the present invention, and is omitted from more detailed views of the present embodiment. However, it is to be understood that if it were required, $T_{offset\_r}$ may be implantation in a similar manner to that of temperature offset circuit $T_{offset\_m}$, described below.

Since in the present embodiment oscillator 6 is implemented as a SAW resonator, the frequency-versus-temperature characteristic curve of oscillator 6 is assumed to be characterized by the concave down curve of FIG. 7. Temperature compensation input VTEMP from summation node 2 should therefore preferably have a shape that is the inverse of the concave-down curve of FIG. 7.

Figure 9:
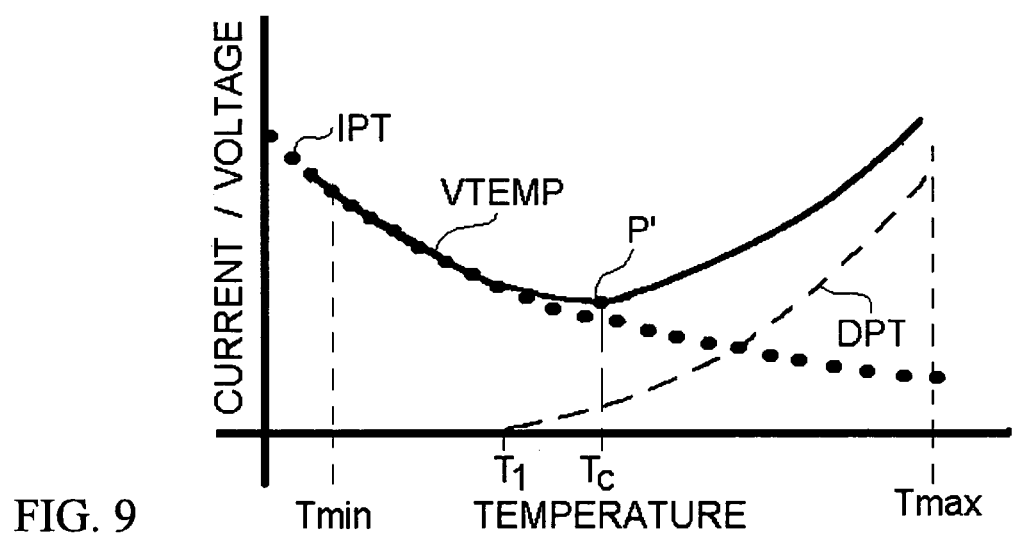
FIG. 9 is an exemplary frequency compensation curve VTEMP in accord with the embodiment of FIG. 8.

With reference to FIG. 9, temperature compensation input VTEMP is shown to be a concave-up curve having characteristics generally inverse that of the concave-down frequency-versus-temperature characteristic curve of FIG. 7. As stated above, temperature compensation input VTEMP may be shifted up or down by means of optional DC offset 20, or any required DC offset may also be obtained by adjusting amplification gains of signal generators SGm and/or SGr.

In FIG. 9, sub-signal IPT of signal generator SGr is indicated by a dotted line, and sub-signal DPT of signal generator SGm is indicated by a dashed line. Sub-signals IPT and DPT are summed at summation node 2 to produce temperature compensation input VTEMP, whose representation between temperature range Tmin to Tmax is indicated by a solid line.

Sub-signal IPT has no temperature offset, and demonstrates a characteristic curve complementary (i.e. inversely related) to temperature. However, sub-signal DPT is halted until activation temperature $T_1$ is reached (i.e. the output of signal generator SGm is offset by $T_1$). Consequently, temperature compensation input VTEMP initially follows sub-signal IPT until temperature $T_1$ is reached and sub-signal DPT is activated. At $T_1$, sub-signal DPT begins to grow with increasing temperature. Both sub-signals IPT and DPT preferably follow an exponential-curve shape, but this is due to the nature of the preferred circuit implementation of signal generators SGm and SGr, explained below, and other directly proportional to temperature and inversely proportional to temperature characteristic curves may be used.

As shown, when sub-signal DPT is activated, temperature compensation input VTEMP begins to separate from sub-signal IPT. Temperature compensation input VTEMP then begins curving upwards as sub-signal DPT increases and sub-signal IPT decreases with temperature. As higher temperatures are reached, sub-signal IPT approaches zero while sub-signal DPT continues to rise, and temperature compensation input VTEMP eventually begins following curve DPT as sub-signal IPT becomes increasingly smaller. This results in temperature compensation input VTEMP having a concave-up shape, as desired for compensating the frequency-versus-temperature characteristic curve of FIG. 7. By appropriate selection of the relatively strengths of sub-signals IPT and DPT, and by appropriate selection of temperature offset T1, temperature compensation input VTEMP can be made to have its minimum point P' at temperature Tc to coincide with the maximum point P of the frequency-versus-temperature characteristic curve of FIG. 7.

Figure 10:
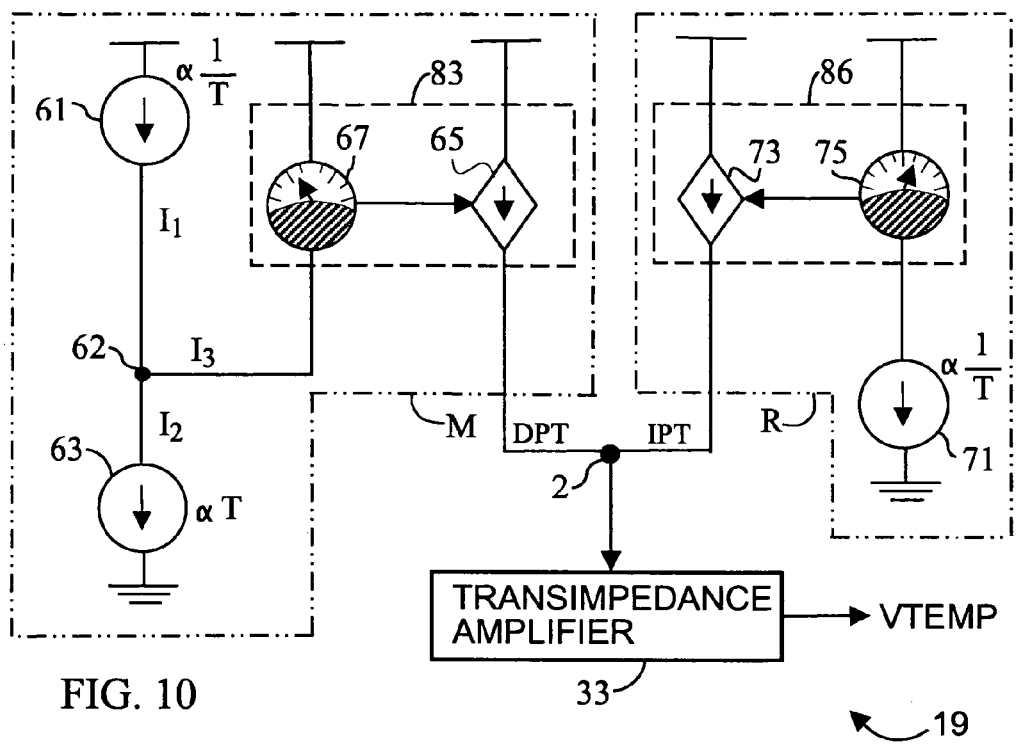
FIG. 10 is a symbolic current-based implementation of modules M and R of FIG. 8.

With reference to FIG. 10, a current based implementation of the temperature compensation circuit 19 of the present invention preferably combines temperature offset $T_{offset\_m}$ and signal generator SGm of FIG. 8 into a single circuit within module M. Furthermore, temperature offset $T_{offset\_r}$ is preferably omitted from module R.

Module M is implemented using a current source 61 having a source current $I_1$, a current sink 63 having a drain current $I_2$, and a dependent current source 65. The output from dependent current source 65 is dependent upon the difference of $I_1$ and $I_2$, which is symbolically represented by a current meter 67. In effect, current meter 67 and dependent current source 65 form a first current mirror 83 to mirror the difference current of node 62.

Module R includes a second current sink 71 and a second dependent current source 73. The output from second dependent current source 73 is dependent upon the current through current sink 71, which is symbolically represented by a second current meter 75. Thus, current meter 75 and dependent current source 73 form a second current mirror 86 to mirror the current through current sink 71. It is to be understood that current sink 71 may be replaced by a current source without deviating from the present invention.

Since FIG. 10 shows a current-based implementation of modules M and R, but it is preferred that variable oscillator 6 be implemented as a voltage controlled oscillator, VCO, the output from summation node 2 is shown coupled to transimpedance amplifier 33 to convert the output current signal from summation node 2 into a representative voltage signal for temperature control input VTEMP.

Preferably, second current sink 71 produces a current whose magnitude is inversely proportional to temperature, such that second dependent current source 73 likewise produces a current inversely proportional to temperature.

In module M, the source current $I_1$ of ideal current source 61 is preferably greater than, or equal to, drain current $I_2$ of ideal current sink 63 for temperatures T up to predefined transition temperature, $T_{TRNSITN}$, as summarized here.

$|I_1| \geq |I_2|$ for $T \leq T_{TRNSITN}$

For temperatures T higher than the predefined transition temperature $T_{TRNSITN}$, the magnitude of current source 61 is made smaller than the magnitude of current sink 63, as summarized here.

$|I_1| < |I_2|$ for $T > T_{TRNSITN}$

To achieve these conditions, current $I_1$ of first current source 61 is preferably inversely proportional to temperature ($\alpha[1/T]$), and the current $I_2$ of first current sink 63 is preferably directly proportional to temperature ($\alpha T$). In this manner when temperature is low, signal $I_1$ is greater than $I_2$, and when temperature is high $I_2$ is greater than $I_1$. The temperature dependence characteristics of current source 61 and current sink 63 are such that the transition in magnitude dominance from $I_1$ to $I_2$ occurs at temperature $T_{TRNSITN}$.

The difference of $I_1$ and $I_2$ is taken at node 62, and this difference current $I_3$, as symbolically observed by current meter 67, determines the output current from dependent current source 67. However, dependent current source preferably outputs a signal DPT only when the difference of $I_2$ and $I_1$ (i.e. $|I_2|-|I_1|$) is positive, and outputs no signal when the difference of $I_2$ and $I_1$ is negative.

The magnitude of current $I_1$ is high at low temperatures, and decreases as temperature T increases. Conversely, the magnitude of current $I_2$ is low at low temperatures and grows exponentially with increasing temperature. The output DPT of dependent current source 65 ideally remains low, i.e. no output signal is produced, while $I_1$ is greater than $I_2$, and starts flowing only when $I_2$ becomes greater than $I_1$. Further preferably, current signal DPT starts flowing only when $I_2$ has risen one threshold value above $I_1$. As the temperature gets much greater and $I_1$ diminishes sufficiently, signal DPT begins to follow $I_2$ such that signal DPT exhibits an exponential curvature.

The description of FIG. 10 shows ideal current sources, and places a limitation that dependent current source 65 should have no output when $I_1$ is greater than $I_2$ in order to achieve the temperature offset $T_1$, and thus the desire current curve for signal DPT. However, these output limitations are inherent in physical circuit components used in the construction of a practical circuit implementation of the structure of FIG. 10, and thus do not pose any added burden to its construction.

Figure 11:
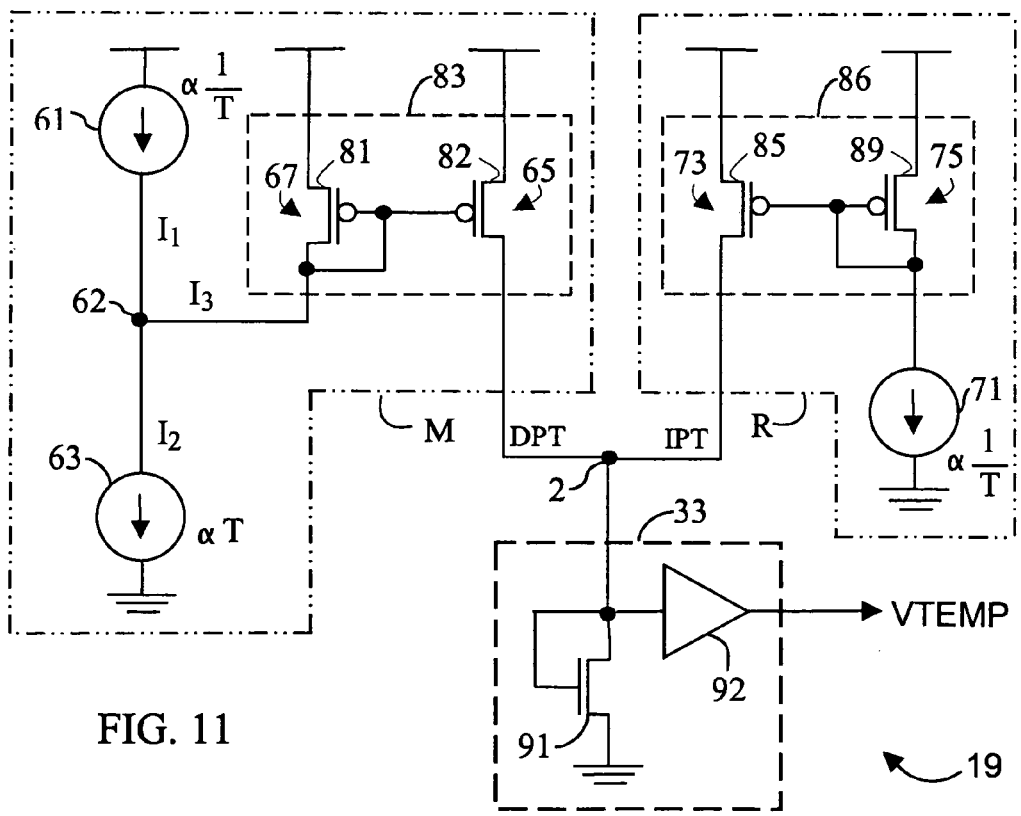
FIG. 11 is a partial circuit implementation of the structure of FIG. 10.

With reference to FIG. 11, the preferred circuit implementation of the present temperature compensation circuit 19 preferably uses MOS technology. It is to be understood that other technologies, such as BJT or NFET, may be used. Further preferably, first current source 61 and current sink 71 are implemented using non-ideal (i.e. practical) CTAT (complementary to absolute temperature) reference circuits, and preferably current sink 63 is implemented using a non-ideal PTAT (proportional to absolute temperature) reference circuit. PTAT and CTAT reference circuits are well known in the art, and are not explained in detail here.

Current meters 67 and 75 are implemented as respective diode-connected PMOS transistors 81 and 89. Also, dependent current sources 65 and 73 are respectively implemented as PMOS transistors 82 and 85. The potential at the control gates of diode-connected transistors 81 and 89 fluctuates with their respective source-to-drain current, such that the potential at their control gates becomes a measure of their respective source-to-drain currents. Since the control gate of PMOS transistor 82 is coupled to the control gate of diode-connected transistor 81, fluctuation in the source-to-drain current of PMOS transistor 82 are made to mirror those of diode-connected transistor 81. In other words, diode-connected transistor 81 and PMOS transistor 82 constitute current mirror 83, which mirrors the difference current of summation node 62. Similarly, diode-connected transistor 89 and PMOS transistor 85 form second current mirror 86, and mirror the current through current sink 71.

The non-idial behavior of the CTAT and PTAT reference circuits implies that no infinite or negative voltages are generated anywhere in the circuit, which might otherwise force diode-connected transistor 81 to unintentionally turn ON. In other words, when CTAT based current source 61 is greater than PTAT based current sink 63 (i.e. at low temperatures), all the current through current sink 63 is supplied by current source 61 and the current through summation node 62 is thus limited by the lower magnitude of current sink 63. As a result, the voltage potential at node 62 rises toward the upper power rail, Vcc. Therefore, the voltage potential at the drain electrode and the control gate electrode of diode-connected transistor 81 also rises toward Vcc causing diode-connected transistor 81 to turn OFF. Since PMOS transistor 82 and diode-connected transistor 81 share the same control gate connection, PMOS transistor 82 is also turned OFF. Therefore, PMOS transistor 82 contributes no signal to summation node 2 while current source 61 is stronger than current sink 63, and summation node 2 thus outputs only the current supplied by transistor 85.

On the other hand, when the current of PTAT based current sink 63 is greater than the current of CTAT based current source 61 (i.e. at higher temperatures), current source 61 cannot supply all the current drawn by current sink 63 causing the potential at node 62 to be drawn toward ground, i.e. the lower power rail. As a result, diode-connected transistor 81 is turned ON and begins producing a source-to-drain current. The current through diode-connected transistor 81 is mirrored by PMOS transistor 82 with an optional amplification gain. At the same time, the current from CTAT based current sink 71 is mirrored in current mirror 86. Thus, the currents from PMOS transistors 82 and 85 are combined at summation node 2 and transferred to transimpedance amplifier 33.

Transimpedance amplifer 33 preferably consists of a diode-connected NMOS transistor 91 and a voltage amplifier 92. Diode-connected NMOS transistor 91 converts the current from summation node 2 into a representative voltage potential at its drain electrode. The drain voltage of NMOS transistor 91 is coupled to voltage amplifier 92, whose output is temperature compensation input VTEMP.

Figure 12:
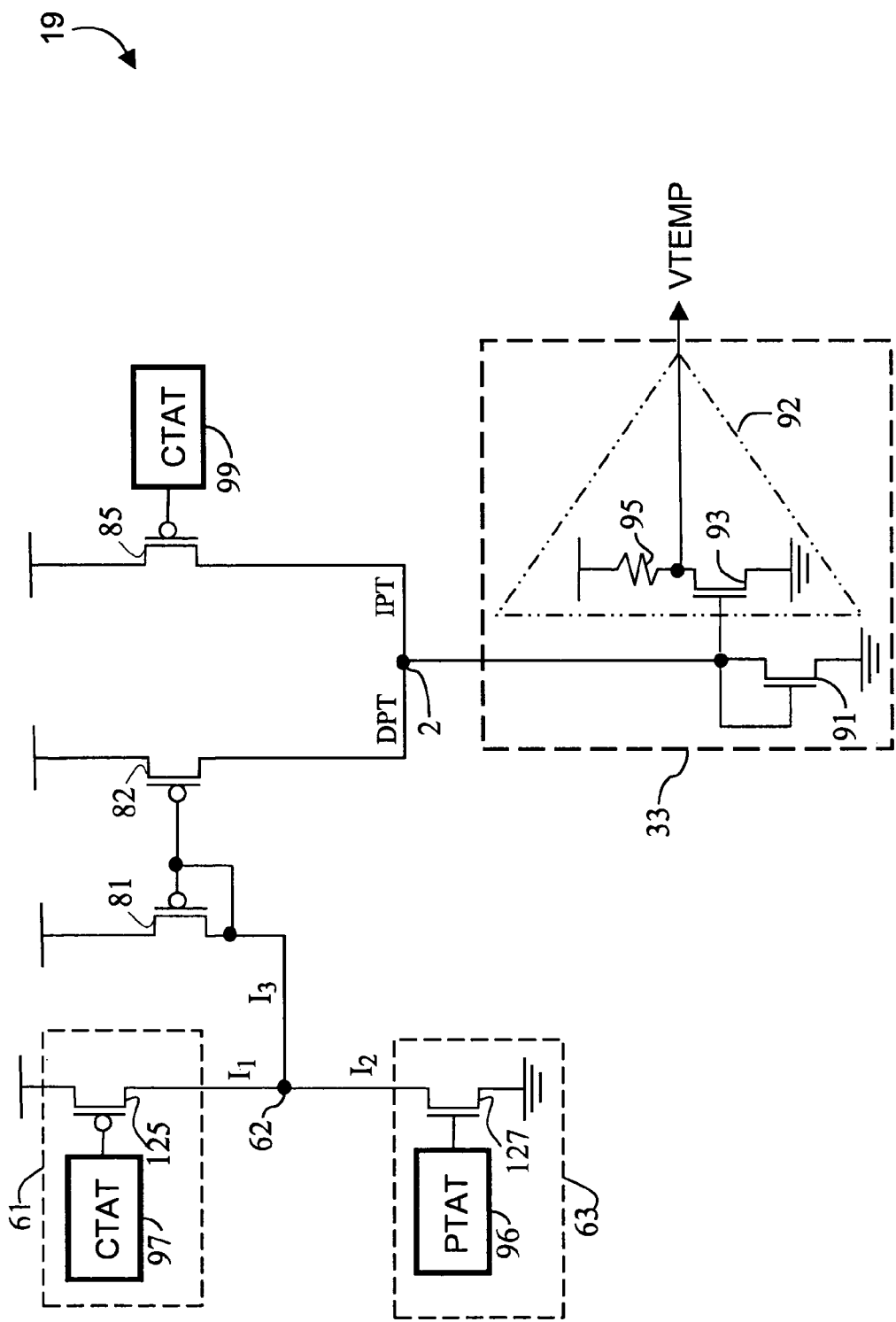
FIG. 12 is a combined circuit-level and block-level diagram of a preferred implementation of the structure of FIG. 11.

A CTAT circuit typically includes a current mirror that can function in place of current mirror 86. Therefore as shown in FIG. 12, transistor 89 (of current mirror 86) and current sink 71 are preferably incorporated into a CTAT source 99. By adjusting the size of transistor 85, one can adjust the weight, i.e. the relative amplification, of the signal from transistor 85 to summation node 2.

As further shown in FIG. 12, current source 61 preferably includes a CTAT reference circuit 97 coupled to control the current through a PMOS transistor 125, and current sink 63 consists of a PTAT reference circuit 96 coupled to control the current through an NMOS transistor 127. As in the case of CTAT 99 and transistor 85, PMOS transistor 125 is used to adjust the weight of the signal from CTAT 97, and NMOS transistor 127 is used to adjust the weight of the signal from PTAT 96.

Additionally, amplifier 92 is illustratively implemented as an MOS transistor 93 and resistor 95 coupled in a voltage follower configuration to generate an amplified voltage representation of the current through diode-connected transistor 91. It is understood that additional circuit elements needed to properly bias the operating point of MOS transistor 93 are not shown.

Figure 13:
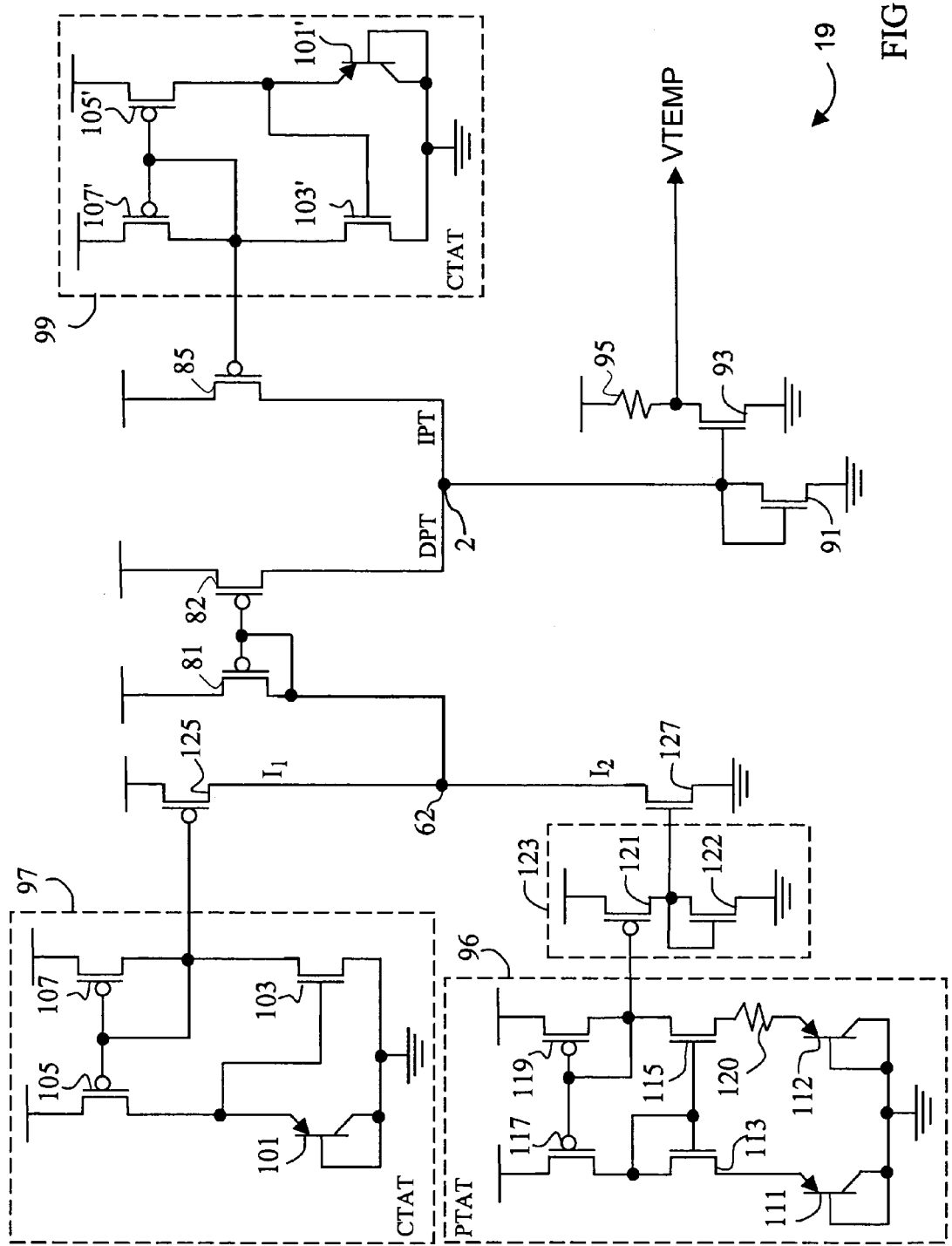
FIG. 13 is a first circuit-level implementation of the structure of FIG. 12.

With reference with FIG. 13, a transistor level implementation of the present temperature compensation circuit 19 is shown. All elements similar to FIGS. 10–12 have similar reference characters and are described above. As it is known in the art, CTAT and PTAT reference circuits make use of the parasitic PNP transistor found in an MOS n-well process. Typically, the emitter is defined by the P+ implant, the base is comprised by the n-well, and the collector is formed by the p-type substrate. In a typical configuration, the parasitic transistor's base is tied to the substrate, which functions as its collector. This collector is coupled to Vss. This results in the parasitic PNP transistor being diode connected. Exemplary CTAT reference sources 97 and 99, and exemplary PTAT reference source 96 preferably use typical circuit structures based on this type of parasitic PNP transistor.

Bipolar transistor, PNP 101, along with MOS transistors 103, 105, and 107 form CTAT reference source 97. CTAT current source 99 is similar to CTAT 97, and all elements in CTAT 99 similar to those of CTAT 97 are identified by a prime symbol (i.e. 101', 103', 105', and 107') and serve a similar function as those of CTAT 97. CTAT circuits 97 and 99 make use of the negative temperature coefficient of the $V_{BE}$ parameter of PNP transistors 101 and 101', respectively, to generate signals that are complementary to absolute temperature (i.e. a CTAT signal). As it is known in the art, this signal is not purely CTAT (i.e. it is not linear), but rather is curved. However, as explained above, the present invention makes use of this curvature to achieve the invention objectives.

PMOS transistor 107 is coupled to PMOS transistor 125 in a current mirror fashion. Similarly, PMOS transistor 107' is coupled to transistor 85 in a current mirror fashion. The voltage at the drain of PMOS transistor 107 is used to generate current $I_1$ in transistor 125, and the voltage at the drain of PMOS transistor 107' is used to generate current IPT in transistor 85.

PTAT reference source 96 is comprised of PNP transistors 111 and 112, along with MOS transistors 113, 115, 117, and 119 and resistor 120.

PTAT 96 uses the difference in $V_{BE}$ of PNP transistors 111 and 112, which are of different physical area and thus have different current densities, to produce a signal that is proportional to absolute temperature (i.e. a PTAT signal). As before, the resultant signal is curved, not linear, but the present invention makes use of this curved signal to achieve the invention objectives. Transistors 121 and 122 constitute an amplifier 123, which together with NMOS transistor 127 provide the appropriate weight to create current $I_2$.

Figure 14:
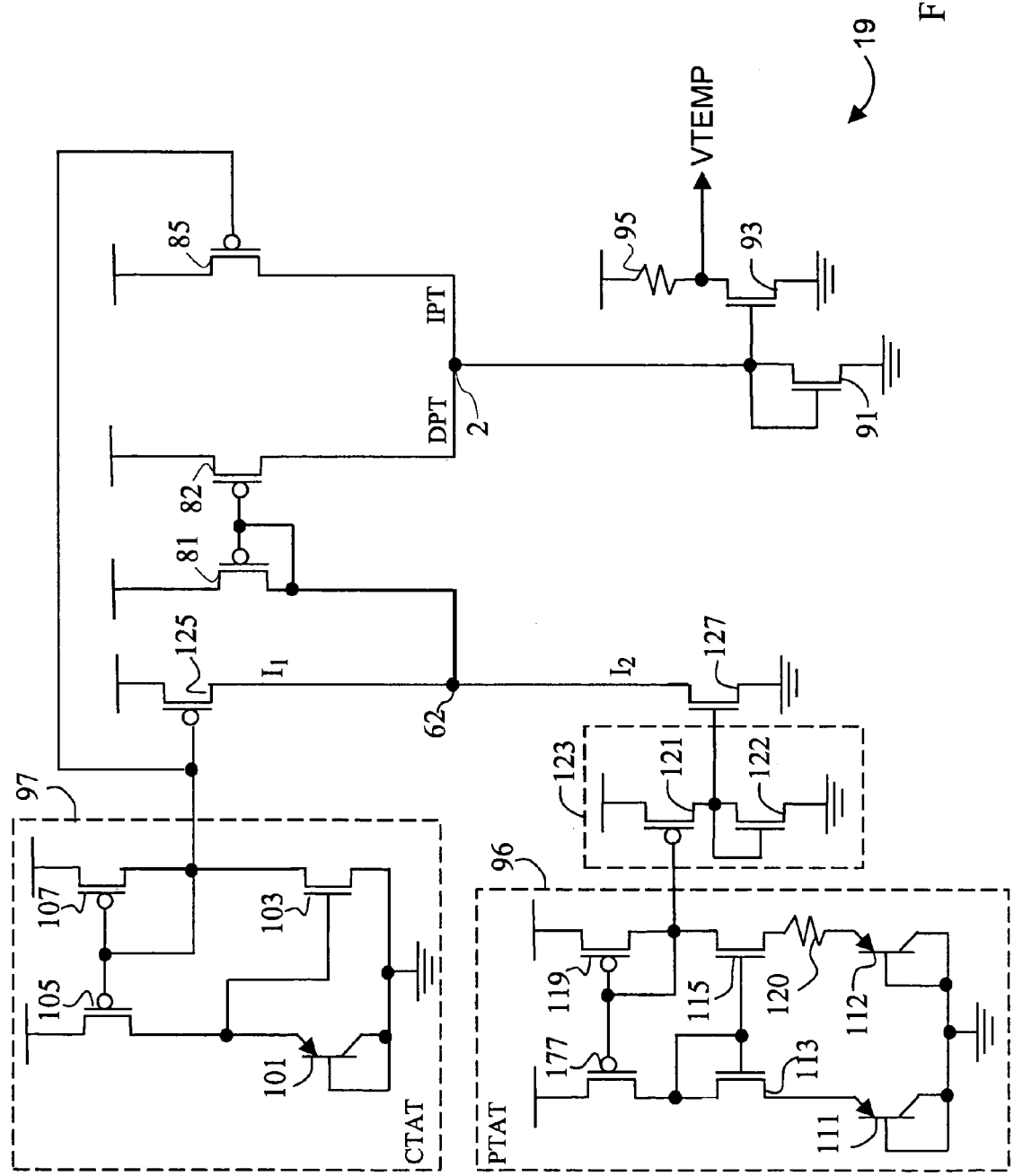
FIG. 14 is a second circuit-level implementation of the structure of FIG. 12.

As is evident from the above description, the circuit of CTAT 97 and the circuit of CTAT 99 are similar, and in a further simplification of the present temperature compensation circuit, shown in FIG. 14, CTAT 99 is eliminated. Instead, the output of CTAT 97 is coupled to drive both transistor 127 and transistor 85. The appropriate signal weights for current signals $I_1$ and IPT can be achieved by appropriate sizing of transistors 127 and 85. All elements in FIG. 14 similar to those of FIG. 13 have similar reference characters and are described above.

Figure 15:
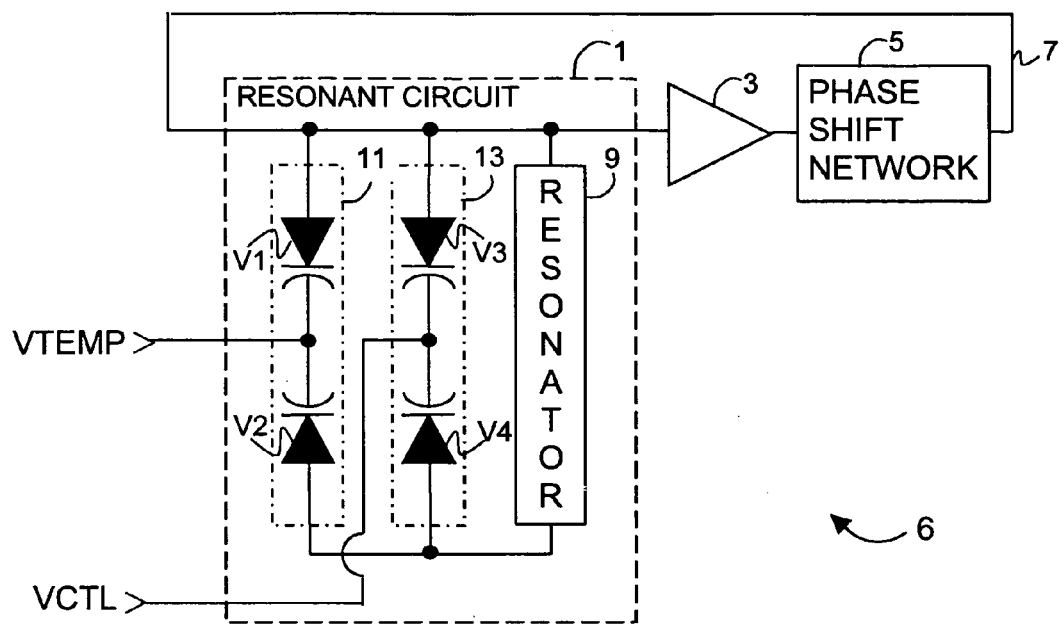
FIG. 15 shows an exemplary implementation of tuner circuits in accord with the present invention.

Returning now to the structure of variable oscillator 6, FIG. 15 shows further detail of the preferred construction of resonant circuit 1. First tuning circuit 11 preferably consists of first and second varactors V1 and V2 with their respective cathodes coupled to each other and to temperature compensation input VTEMP. Similarly, second tuning circuit 13 preferably consists of third and fourth varactors V3 and V4 with their respective cathodes coupled to each other and to functional frequency control input VCTL. The anodes of varactors V1 and V3 are coupled together and to one end of resonator 9. Likewise, the anodes of varactors V2 and V4 are couple together and the other end of resonator 9, such that varactor pair V1/V2, varactor pair V3/V4 and resonator 9 are coupled in parallel. As it is known in the art, varactors are variable diodes whose capacitance value is modulated by an applied voltage across them. Thus, by adjusting the voltage potential of VTEMP and/or VCTL, one can adjust their capacitive value, i.e. the reactance, of respective tuning circuits 11 and 13. By so doing, one can pull the resonant frequency of resonator 9 and thereby tune oscillator 6. In the present case, the varactors are connected as shown to isolate the DC control voltages of VTEMP and VCTL from the operation of oscillator 6.

Figure 16:
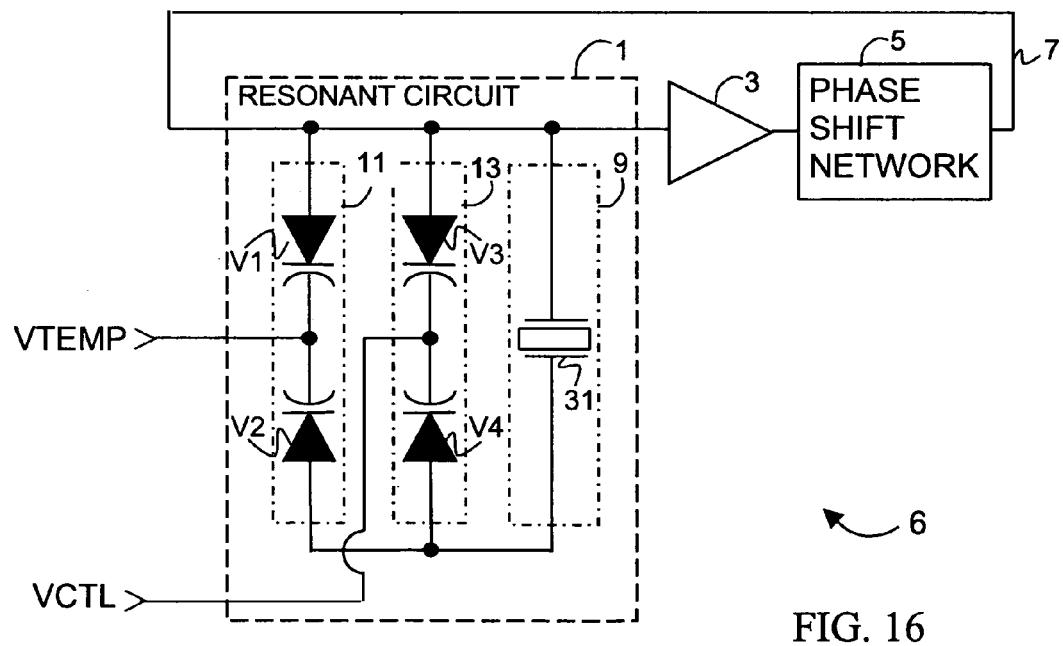
FIG. 16 shows the use of a crystal to implement the resonator of the present invention.

FIG. 16 shows how this concept may be applied to a crystal oscillator. In the present case, resonator 9 is implemented as a piezoelectric crystal 31, such as a quartz crystal. Oscillator 6 has the same two varactor pairs V1/V2 and V3/V4, which pull crystal 31. As before, gain stage 3 and phase shift network 5 provide the gain and phase characteristic necessary for oscillation of crystal 31. The centering principle of the two varactor pairs is the same as that describe above.

With reference to FIG. 17, an alternate embodiment for a variable oscillator 6 in accord with the present invention shows a feedback path around resonant circuit 1 that goes through a pair of cross-coupled inverter, INV1 and INV2. Cross-coupled inverters INV1 and INV2 provide both, at least a partial gain stage and partial phase shift stage. The output of INV1 is coupled to the input of INV2, and the output of INV2 is coupled to the input of INV1. This circuit further provides both a true output OUT at the input of INV2 and a complement output OUT_C at the input of INV1. Preferably, the current through cross-coupled inverters INV1/INV2 and through resonant circuit 1 is controlled by a current source (see FIG. 19) to assure appropriate operating bias conditions. Again, the varactors are connected as shown to isolate the DC control voltage of VTEMP and VCTL from the bias voltages of inverters INV1 and INV2.

FIG. 18 shows how this principle may be applied to a digital LC tank VCO. In the present case, resonator 9 is implemented as an inductor 35, and the LC tank is formed by the parallel combination of inductor 35 and the capacitance operation of varactor pairs V1/V2 and V3/V4. The resonant frequency is determined by inductor 35 and the parallel combination of the two varactor pairs V1/V2 and V3/V4. Temperature control input VTEMP ensures that the center frequency of input VCTL remains constant over the full temperature range. Thus, the pull range of variable oscillator 6 is made independent of temperature and retains full symmetry irrespective of the value of VTEMP.

Figure 19:
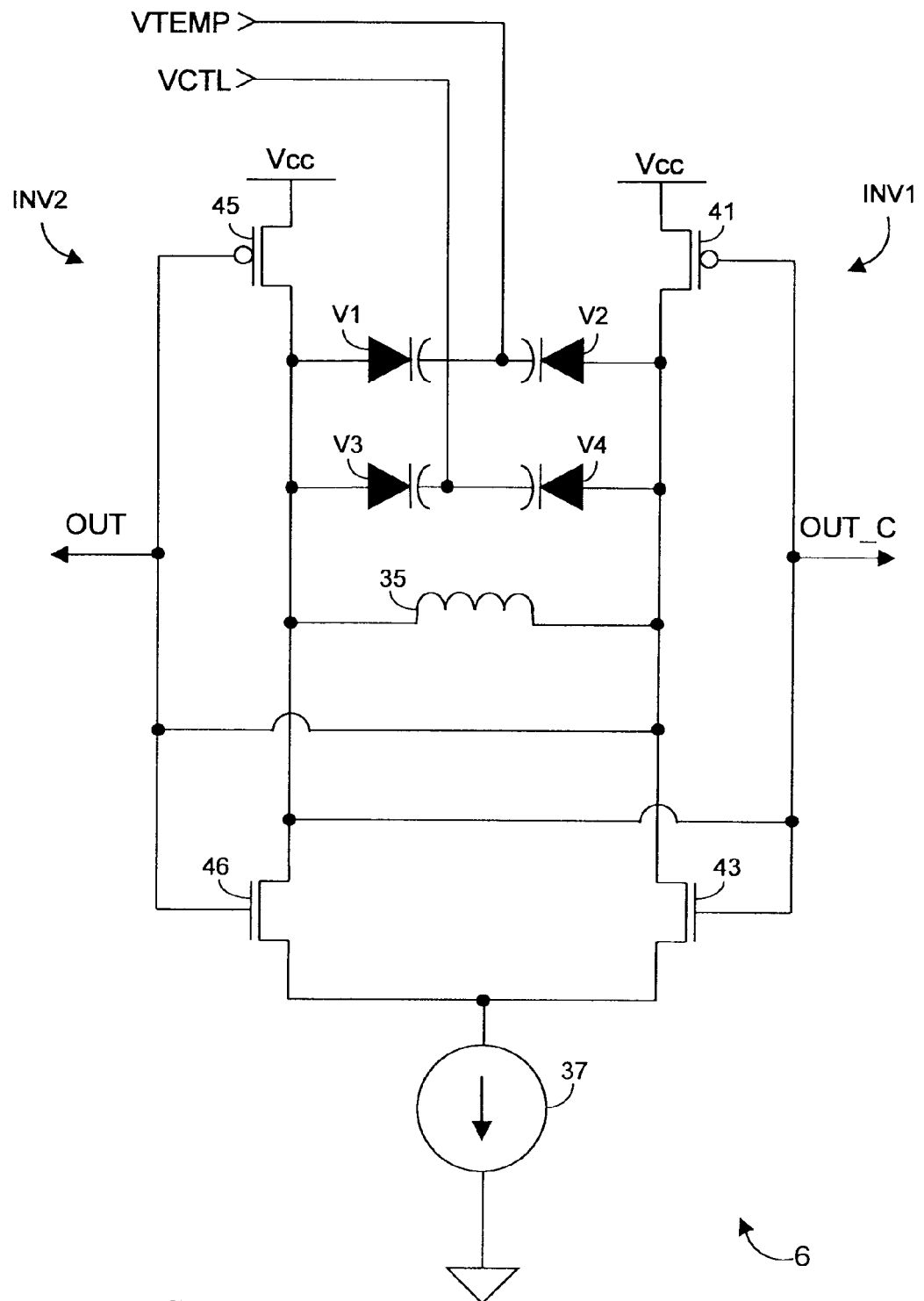
FIG. 19 is a partial transistor-level implementation of the structure of FIG. 18.

With reference to FIG. 19, a transistor level implementation of the circuit of FIG. 18 is shown. Inverter INV1 consists of PMOS transistor 41 and NMOS transistor 43. Inverter INV2 consists of PMOS transistor 45 and transistor 46. The source electrodes of PMOS transistors 41 and 45 are coupled to the upper power rail, Vcc, and the source electrodes of NMOS transistors 46 and 43 are coupled to the lower power rail, ground, through tail current source 37. Tail current source 37 provides current that flows between the two cross coupled inverters INV1 and INV2, and through the resonant circuit, which is composed of varactor pairs V1/V2 and V3/V4 and inductor 35. The control gates of transistors 45 and 46 are tied together and are tapped as the true output of oscillator 6, and the control gates of transistors 41 and 43 are tied together and are tapped as the complement output of oscillator 6. The drain electrodes of transistors 45 and 46 are tied together and to the control gates of transistors 41 and 43. Similarly, the drain electrodes of transistors 41 and 43 are tied together and to the control gates of transistors 45 and 46. Varactors pairs V1/V2 and V3/V4 along with inductor 35 are coupled in parallel across the, out puts of inverters INV1 and INV2. As before, temperature compensation input VTEMP is coupled to the junction node between varactors V1 and V2, and functional frequency control input VCTL is coupled to the junction node between varactors V3 and V4.

The above-described variable oscillator 6 of FIGS. 1–19 is suitable for use in various frequency precision devices. For example, the above described variable oscillator 6 may be used to generate an internal clock, such as a system clock in high frequency equipment and/or high frequency communication devices. A typical use of the present variable oscillator would be in wireless communication devices, such as cellular telephones.

The present invention has been described in connection with various preferred embodiments thereof with reference to the accompanying drawings. However, various changes and modifications will be apparent to those skilled in the art based on the foregoing description. Such changes and modifications are intended to be included within the scope of the present invention to the extent they fall within the scope of the appended claims.

What is claimed is:

1. A variable frequency oscillator, comprising:
   a temperature compensation input node;
   a frequency control input node;
   a resonant circuit including:
      a first tunable sub-circuit responsive to said temperature compensation input node for modifying the resonant frequency of said resonant circuit;
      a second tunable sub-circuit responsive to said frequency control input node for modifying the resonant frequency of said resonant circuit;
      wherein in normal use, said first tunable sub-circuit continuously responds to said temperature compensation input node to compensate for resonant drifts in said resonant circuit due to temperature variations while said second tunable sub-circuit continuously responds to varying frequency modification signals at said frequency control input node;
   a temperature compensation circuit coupled to said temperature compensation input, and effective for continuously producing a temperature compensation signal in accordance with temperature variations, said temperature compensation circuit including:
   a plurality of first modules each effective for producing a respective first signal directly proportional to temperature;
   a plurality of second modules each effective for producing a respective second signal inversely proportional to temperature;
   a first summing node for summing all of said first and second signals and producing a resultant summed signal.

2. The variable frequency oscillator of claim 1, wherein:
   the strength of each first signal of said plurality of first modules is individually selectable; and
   the strength of each second signal of said plurality of second modules is individually selectable.

3. The variable frequency oscillator of claim 1, wherein:
each of said plurality of first modules has an optionally assigned first temperature offset, wherein each of said plurality of first modules is precluded from outputting its respective first signal for temperatures below its respectively assigned first temperature offset.

4. The variable frequency oscillator of claim 1, wherein each of said plurality of second modules has an optionally assigned second temperature offset, wherein each of said plurality of second modules is precluded from outputting its respective second signal for temperatures below its respectively assigned second temperature offset.

5. The variable frequency oscillator of claim 1, wherein:
each of said plurality of first modules has an optionally assigned first temperature offset, wherein each of said plurality of first modules is precluded from outputting its respective first signal for temperatures below its respectively assigned first temperature offset; and
each of said plurality of second modules has an optionally assigned second temperature offset, wherein each of said plurality of second modules is precluded from outputting its respective second signal for temperatures below its respectively assigned second temperature offset.

6. The variable frequency oscillator of claim 1, wherein each of said plurality of first modules and each of said plurality of second modules includes a first CTAT signal source.

7. The variable frequency oscillator of claim 6, wherein at least one of said plurality of first modules further includes:
a CTAT signal source;
a PTAT signal source;
a second summing node for creating a difference signal based on the difference in signal magnitude of said CTAT signal source and said PTAT signal source; and
a first dependent signal generator for producing an intermediate signal dependent on said difference signal.

8. The variable frequency oscillator of claim 7, wherein said dependent signal generator produces said intermediate signal only if said difference signal is above a predetermined threshold value.

9. The variable frequency oscillator of claim 7, wherein said difference signal is a measure of a temperature offset, wherein said at least one of said plurality of first modules produces substantially no signal for temperatures below said temperature offset.

10. The variable frequency oscillator of claim 7, wherein:
for temperatures lower than a predefined transition temperature the magnitude of said CTAT signal source is greater than said PTAT signal source; and
for temperatures higher than said predefined transition temperature the magnitude of said PTAT signal source is greater than said CTAT signal source.

11. An electronic device including the variable frequency oscillator of claim 1.

12. A variable frequency oscillator comprising:
a first inverter and a second inverter forming a cross-coupled network defined by having the output of said first inverter coupled to the input of said second inverter and having the output of said second inverter coupled to the input of said first inverter;
a resonant circuit including:
a resonator;
a first tunable sub-circuit responsive to a temperature compensation input node for modifying the resonant frequency of said resonant circuit in accordance with temperature variations;
a second tunable sub-circuit responsive to a frequency control input node for modifying the resonant frequency of said resonant circuit;
wherein said resonator, first tunable sub-circuit, and second tunable sub-circuit are connected in parallel;
wherein said resonant circuit is coupled in parallel to said cross-coupled network;
wherein said temperature compensation input node is effective for receiving a temperature compensation signal independent of said a frequency control input node receiving a frequency control signal; and
a temperature compensation circuit for continuously producing said temperature compensation signal in accordance with temperature variations, wherein said temperature compensation circuit includes:
a plurality of first modules each effective for producing a respective first signal directly proportional to temperature;
a plurality of second modules each effective for producing a respective second signal inversely proportional to temperature;
a first summing node for summing all of said first and second signals and producing a resultant summed signal.

13. The variable frequency oscillator of claim 12, wherein:
the strength of each first signal of said plurality of first modules is individually selectable; and
the strength of each second signal of said plurality of second modules is individually selectable.

14. The variable frequency oscillator of claim 12, wherein:
each of said plurality of first modules has an optionally assigned first temperature offset, wherein each of said plurality of first modules is precluded from outputting its respective first signal for temperatures below its respectively assigned first temperature offset.

15. The variable frequency oscillator of claim 12, wherein each of said plurality of second modules has an optionally assigned second temperature offset, wherein each of said plurality of second modules is precluded from outputting its respective second signal for temperatures below its respectively assigned second temperature offset.

16. The variable frequency oscillator of claim 12, wherein:
each of said plurality of first modules has an optionally assigned first temperature offset, wherein each of said plurality of first modules is precluded from outputting its respective first signal for temperatures below its respectively assigned first temperature offset; and
each of said plurality of second modules has an optionally assigned second temperature offset, wherein each of said plurality of second modules is precluded from outputting its respective second signal for temperatures below its respectively assigned second temperature offset.

17. The variable frequency oscillator of claim 12, wherein each of said plurality of first modules and each of said plurality of second modules includes a first CTAT signal source.

18. The variable frequency oscillator of claim 17, wherein at least one of said plurality of first modules further includes:
a CTAT signal source;
a PTAT signal source;
a second summing node for creating a difference signal based on the difference in signal magnitude of said CTAT signal source and said PTAT signal source; and a first dependent signal generator for producing an intermediate signal dependent on said difference signal.

19. The variable frequency oscillator of claim 18, wherein said dependent signal generator produces said intermediate signal only if said difference signal is above a predetermined threshold value.

20. The variable frequency oscillator of claim 18, wherein said difference signal is a measure of a temperature offset, wherein said at least one of said plurality of first modules produces substantially no signal for temperatures below said temperature offset.

21. The variable frequency oscillator of claim 18, wherein:
for temperatures lower than a predefined transition temperature the magnitude of said CTAT signal source is greater than said PTAT signal source; and
for temperatures higher than said predefined transition temperature the magnitude of said PTAT signal source is greater than said CTAT signal source.

22. An electronic device including the variable frequency oscillator of claim 12.

23. A variable frequency oscillator, comprising:
a gain stage;
a phase shift stage;
a resonant circuit, said resonant circuit including:
 a resonator module; and
 a plurality of tunable sub-circuits, each being coupled in parallel to said resonator module, and being responsive to a corresponding frequency control input;
wherein at least one of said plurality of tunable sub-circuits is responsive to a temperature compensation input effective for receiving a temperature compensation signal independent of the remaining of said plurality of tunable circuits; and
a temperature compensation circuit for continuously producing said temperature compensation signal in accordance with temperature variations, wherein said temperature compensation circuit includes:
a plurality of first modules each effective for producing a respective first signal directly proportional to temperature;
a plurality of second modules each effective for producing a respective second signal inversely proportional to temperature;
a first summing node for summing all of said first and second signals and producing a resultant summed signal.

24. The variable frequency oscillator of claim 23, wherein:
the strength of each first signal of said plurality of first modules is individually selectable; and
the strength of each second signal of said plurality of second modules is individually selectable.

25. The variable frequency oscillator of claim 23, wherein:
each of said plurality of first modules has an optionally assigned first temperature offset, wherein each of said plurality of first modules is precluded from outputting its respective first signal for temperatures below its respectively assigned first temperature offset.

26. The variable frequency oscillator of claim 23, wherein each of said plurality of second modules has an optionally assigned second temperature offset, wherein each of said plurality of second modules is precluded from outputting its respective second signal for temperatures below its respectively assigned second temperature offset.

27. The variable frequency oscillator of claim 23, wherein:
each of said plurality of first modules has an optionally assigned first temperature offset, wherein each of said plurality of first modules is precluded from outputting its respective first signal for temperatures below its respectively assigned first temperature offset; and
each of said plurality of second modules has an optionally assigned second temperature offset, wherein each of said plurality of second modules is precluded from outputting its respective second signal for temperatures below its respectively assigned second temperature offset.

28. The variable frequency oscillator of claim 23, wherein each of said plurality of first modules and each of said plurality of second modules includes a first CTAT signal source.

29. The variable frequency oscillator of claim 28, wherein at least one of said plurality of first modules further includes:
a CTAT signal source;
a PTAT signal source;
a second summing node for creating a difference signal based on the difference in signal magnitude of said CTAT signal source and said PTAT signal source; and
a first dependent signal generator for producing an intermediate signal dependent on said difference signal.

30. The variable frequency oscillator of claim 29, wherein said dependent signal generator produces said intermediate signal only if said difference signal is above a predetermined threshold value.

31. The variable frequency oscillator of claim 29, wherein said difference signal is a measure of a temperature offset, wherein said at least one of said plurality of first modules produces substantially no signal for temperatures below said temperature offset.

32. The variable frequency oscillator of claim 29, wherein:
for temperatures lower than a predefined transition temperature the magnitude of said CTAT signal source is greater than said PTAT signal source; and
for temperatures higher than said predefined transition temperature the magnitude of said PTAT signal source is greater than said CTAT signal source.

33. An electronic device including the variable frequency oscillator of claim 23.

* * * * *